United States Patent
Tsai et al.

(10) Patent No.: US 8,796,813 B2
(45) Date of Patent: Aug. 5, 2014

(54) METHOD FOR CONTROLLING ELECTRICAL PROPERTY OF PASSIVE DEVICE DURING FABRICATION OF INTEGRATED COMPONENT AND RELATED INTEGRATED COMPONENT

(71) Applicant: Mediatek Inc., Hsin-Chu (TW)

(72) Inventors: Ming-Da Tsai, Miaoli County (TW); George Chien, Saratoga, CA (US); Cheng-Chou Hung, Hsinchu County (TW)

(73) Assignee: MediaTek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/797,992

(22) Filed: Mar. 12, 2013

(65) Prior Publication Data

US 2014/0035096 A1    Feb. 6, 2014

Related U.S. Application Data

(60) Provisional application No. 61/677,843, filed on Jul. 31, 2012.

(51) Int. Cl.
*H01L 21/71* (2006.01)
*H01L 27/02* (2006.01)

(52) U.S. Cl.
USPC ............ 257/528; 257/E21.536; 257/E27.009; 438/10

(58) Field of Classification Search
USPC .................. 257/528–543, E21.536, E27.009; 438/10–13, 17, 18
See application file for complete search history.

(56) References Cited

U.S. PATENT DOCUMENTS 7,835,157 B2    11/2010   Tilmans
8,338,192 B2 *  12/2012   Le Neel et al. ................. 438/13

\* cited by examiner

*Primary Examiner* — Daniel Shook
(74) *Attorney, Agent, or Firm* — Winston Hsu; Scott Margo

(57) ABSTRACT

A method for controlling an electrical property of a passive device during a fabrication of an integrated component includes providing a substrate, manufacturing the passive device on the substrate, measuring the electrical property of the passive device to obtain a measuring result, determining at least one layout pattern corresponding to at least one later manufacturing process by the measuring result for adjusting the electrical property of the passive device, and continuing the rest of the fabrication including the at least one later manufacturing process of the integrated component.

23 Claims, 28 Drawing Sheets

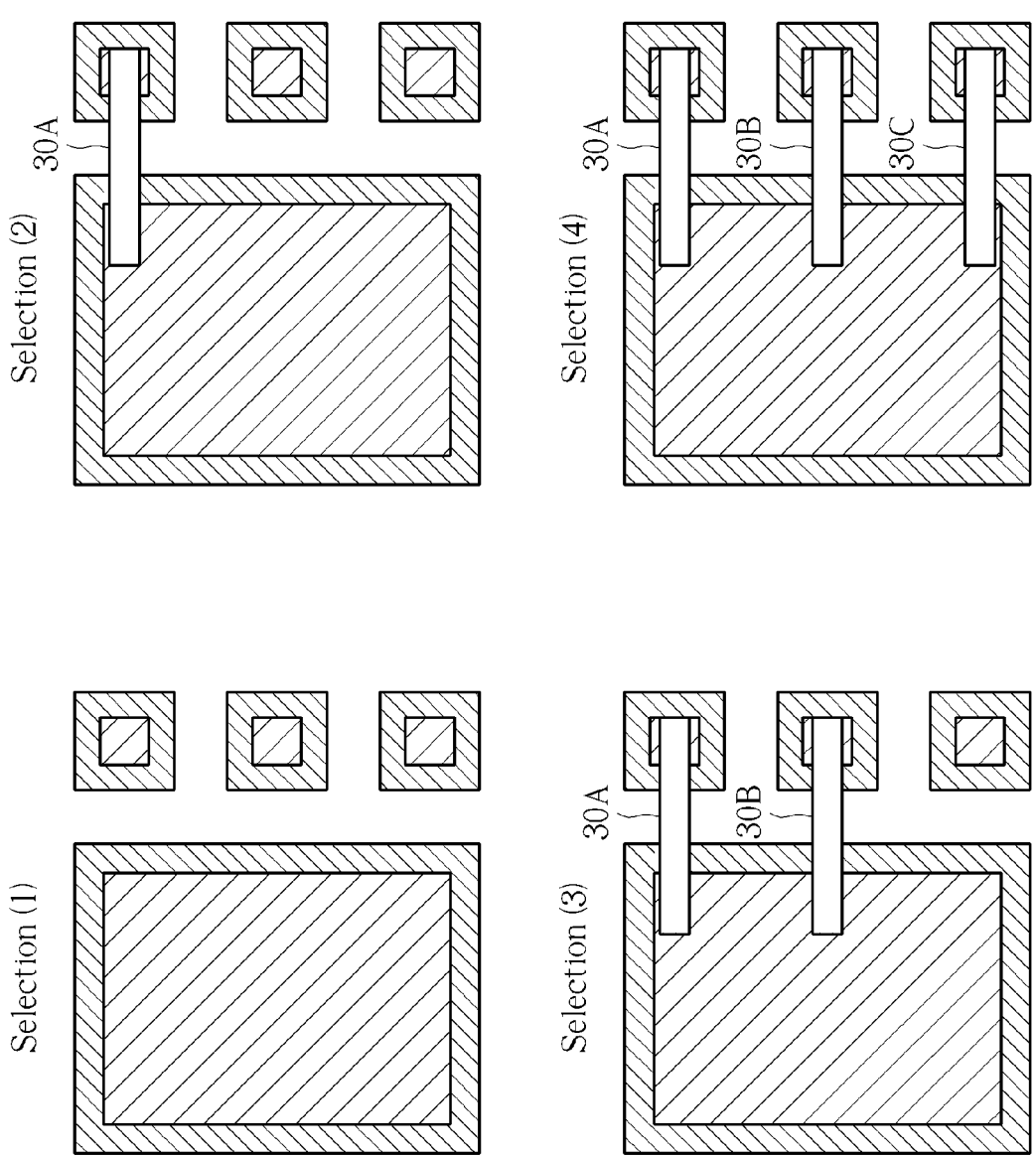

METHOD FOR CONTROLLING ELECTRICAL PROPERTY OF PASSIVE DEVICE DURING FABRICATION OF INTEGRATED COMPONENT AND RELATED INTEGRATED COMPONENT

CROSS REFERENCE TO RELATED APPLICATIONS

This application claims the benefit of U.S. provisional application No. 61/677,843, filed Jul. 31, 2012, and the entirety of which is incorporated by reference herein.

BACKGROUND

The present invention relates generally to an integrated component and a method for controlling the electrical property of a passive device during the fabrication of the integrated component. More particularly, the present invention relates to a method for controlling the electrical property of the passive device by selecting at least one layout pattern of a later manufacturing process of the fabrication of the integrated component and the related structure of the integrated component.

Many electrical products have at least one integrated circuit (IC) chip inside for providing electricity control function. An IC chip may include many integrated components, such as logic circuits or active or passive devices. The electrical properties of all the devices of the integrated components are critical because they affect the performances of the IC chip. In mass production, when fabricating integrated components on a wafer, there are many factors that influence the stability of the electrical properties of the produced integrated components, such as process variation. For example, the process variation may occur when producing integrated component products with different tools or facilities. When process variation occurs, which bring unexpected variations of electrical properties of the produced integrated components, the performance of the product will be effected. Usually, the manufacturer can only throw away the products when the performance is beyond the standard. Or, before fabrication, the integrated components have to be over-designed in order to cover the process variation. In either way, the fabrication cost or the performance of the integrated components is sacrificed. Accordingly, it is still an issue for the manufacturer of integrated components and IC designer to improve the yield of integrated components or decrease the effect of process variation for reducing the fabrication cost and improving the performance.

SUMMARY

It is therefore one of the objects of the present invention to provide a method for controlling the electrical property of the passive device during fabricating an integrated component and a corresponding integrated component including a passive device and at least one sub-cell adjacent to the passive device for solving the above-mentioned problems.

In one aspect, this disclosure provides a method for controlling the electrical property of a passive device in a fabrication of an integrated component. The method includes providing a substrate, manufacturing the passive device on the substrate, measuring an electrical property of the passive device to obtain a measuring result, determining at least one layout pattern corresponding to at least one later manufacturing process by the measuring result for adjusting the electrical property of the passive device, and continuing the rest of the fabrication of the integrated component including the at least one later manufacturing process.

In another aspect, this disclosure provides an integrated component including a semiconductor substrate, a passive device formed on the semiconductor substrate and including at least one first conductive element, and at least one sub-cell disposed adjacent to the passive device. The sub-cell is used for adjusting an electrical property of the passive device through at least one manufacturing process. The sub-cell comprises at least one first sub-cell conductive element, wherein the first sub-cell conductive element and the first conductive element of the passive device are formed with a same first conductive layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1b is a schematic top view of an integrated component of a variant embodiment of the first embodiment of the present invention shown in FIG. 1a.

FIG. 2a is a schematic cross-sectional view along the cross line A-A' shown in FIG. 1a.

FIG. 3 is a schematic diagram illustrating four selections of the layout pattern corresponding to at least one later manufacturing process according to the first embodiment.

DETAILED DESCRIPTION

To provide a better understanding of the present invention to the skilled users in the technology of the present invention, preferred embodiments will be detailed as follows. The embodiments of the present invention are illustrated in the accompanying drawings with numbered elements to elaborate on the contents and effects to be achieved.

Figure 1A:
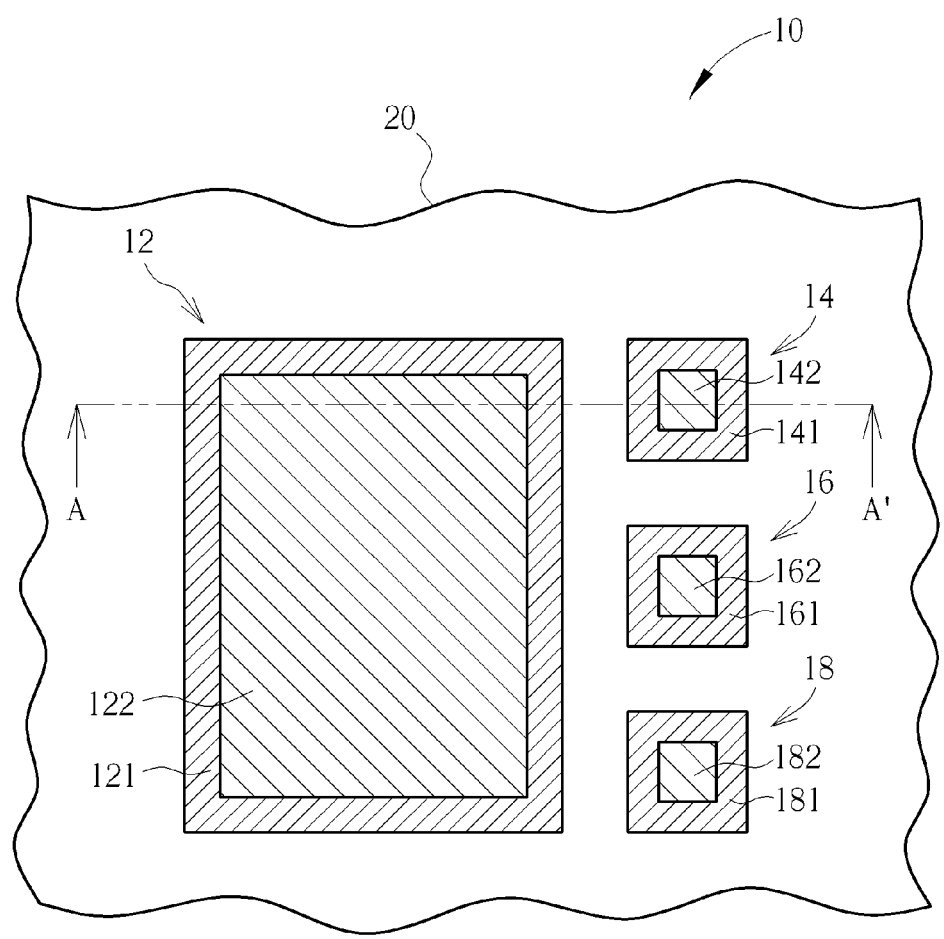
FIG. 1a is a schematic top view of an integrated component depicts a method of controlling an electrical property of a passive device during a fabrication of the integrated component according to a first embodiment of the present invention.
Figure 4:
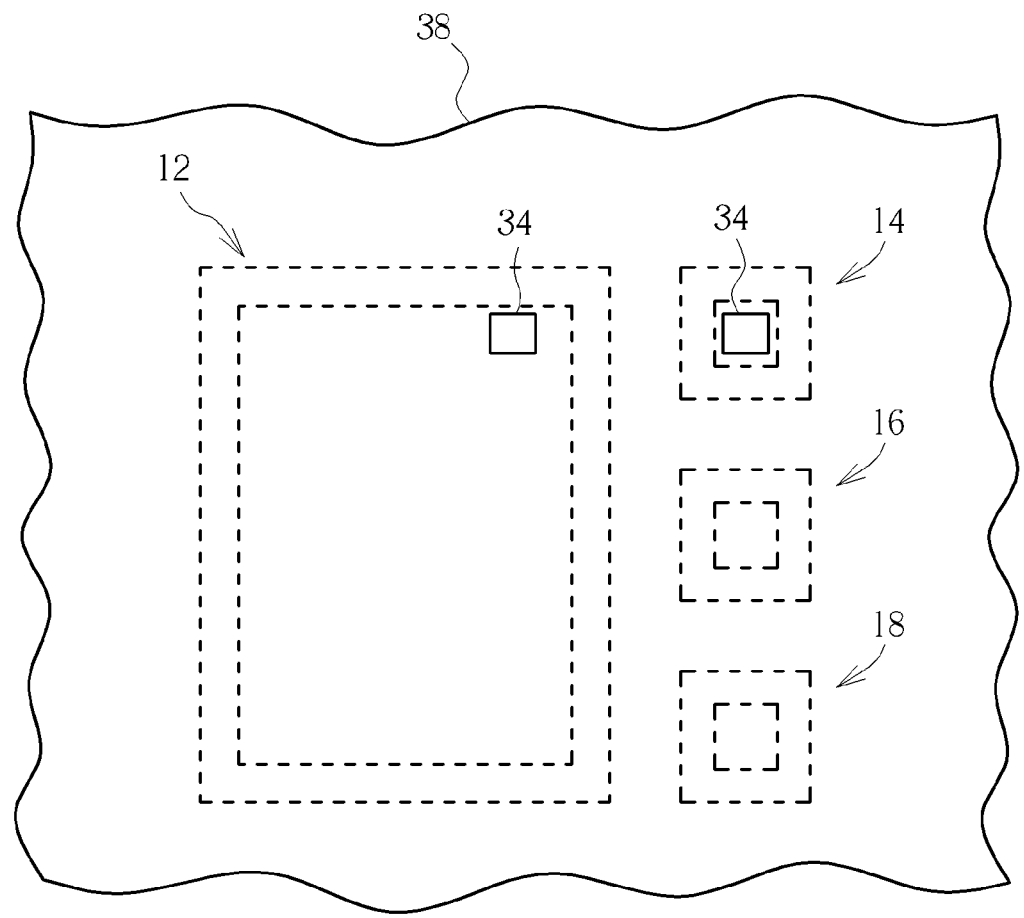
FIG. 4 depicts a selected first photomask for the later manufacturing processes according to the first embodiment.
Figure 5:
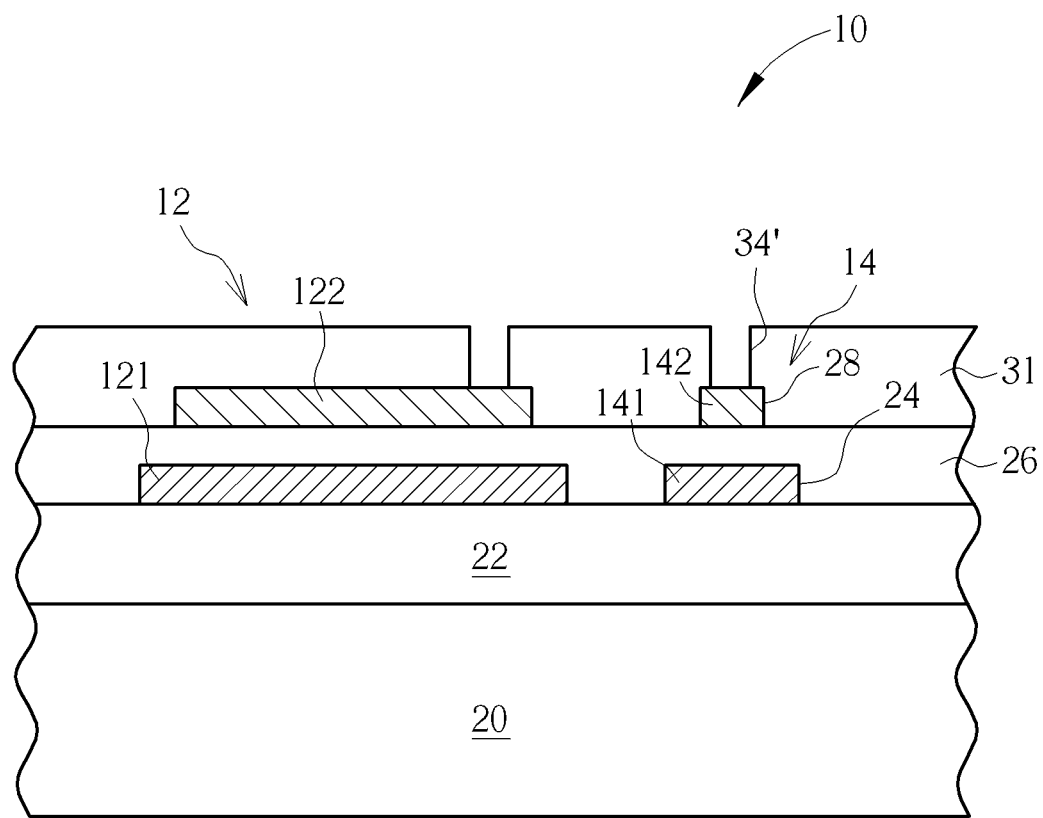
FIG. 5 is a schematic cross-sectional view of the integrated component according to the first embodiment.
Figure 6:
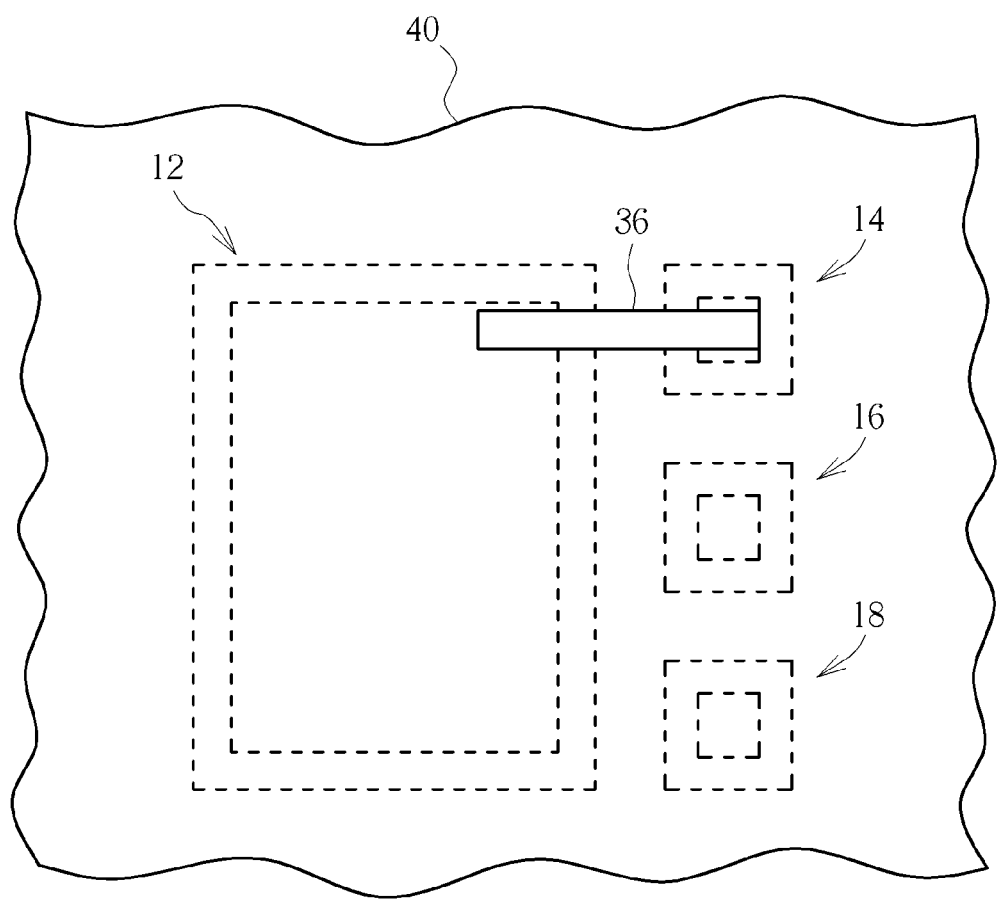
FIG. 6 depicts a selected second photomask for the later manufacturing processes according to the first embodiment.
Figure 7:
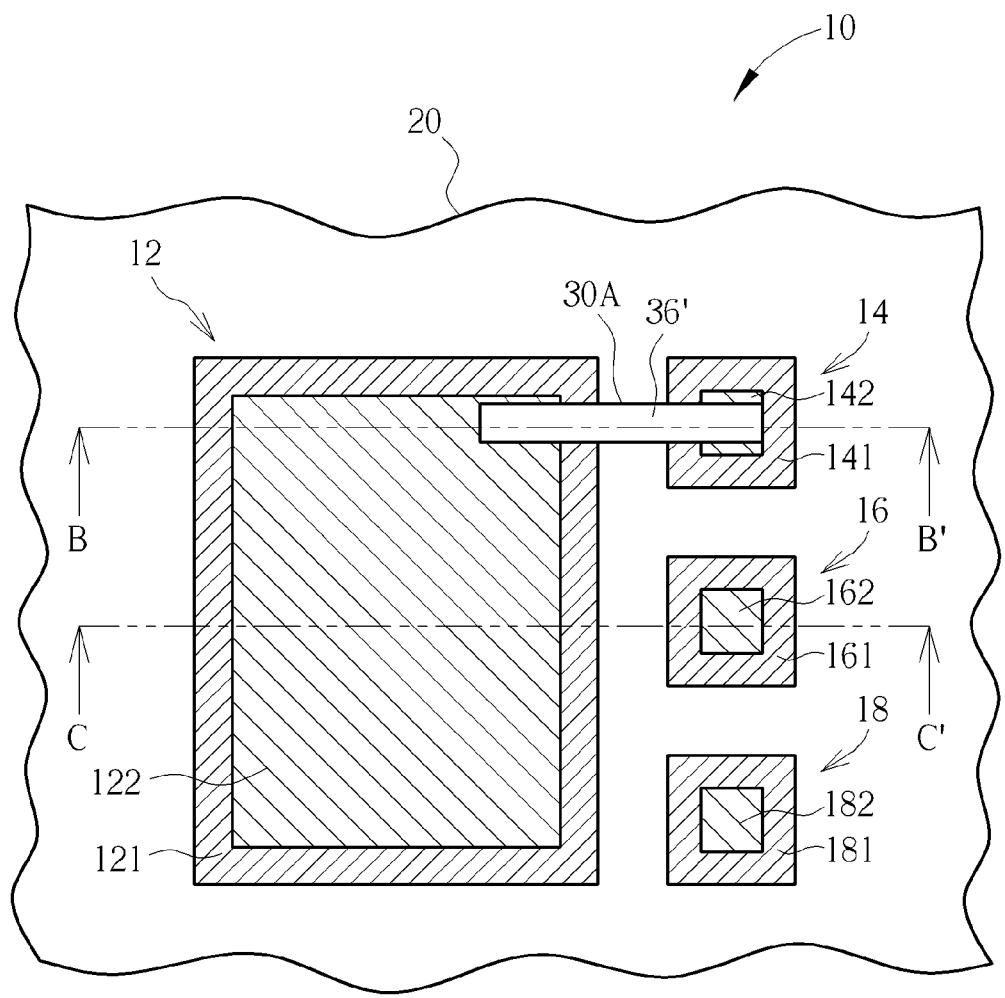
FIG. 7 is a schematic top view of the integrated component after the connecting element is manufactured according to the first embodiment.
Figure 8:
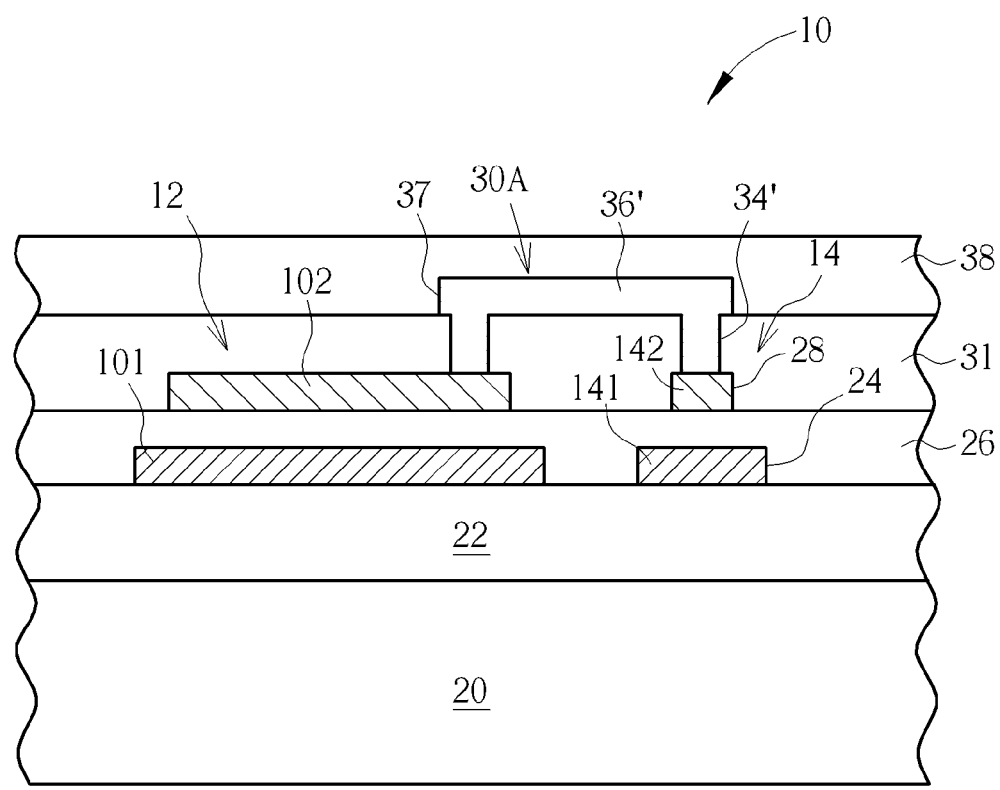
FIG. 8 is a schematic cross-sectional view of the integrated component along a cross line B-B' shown in FIG. 7.
Figure 9:
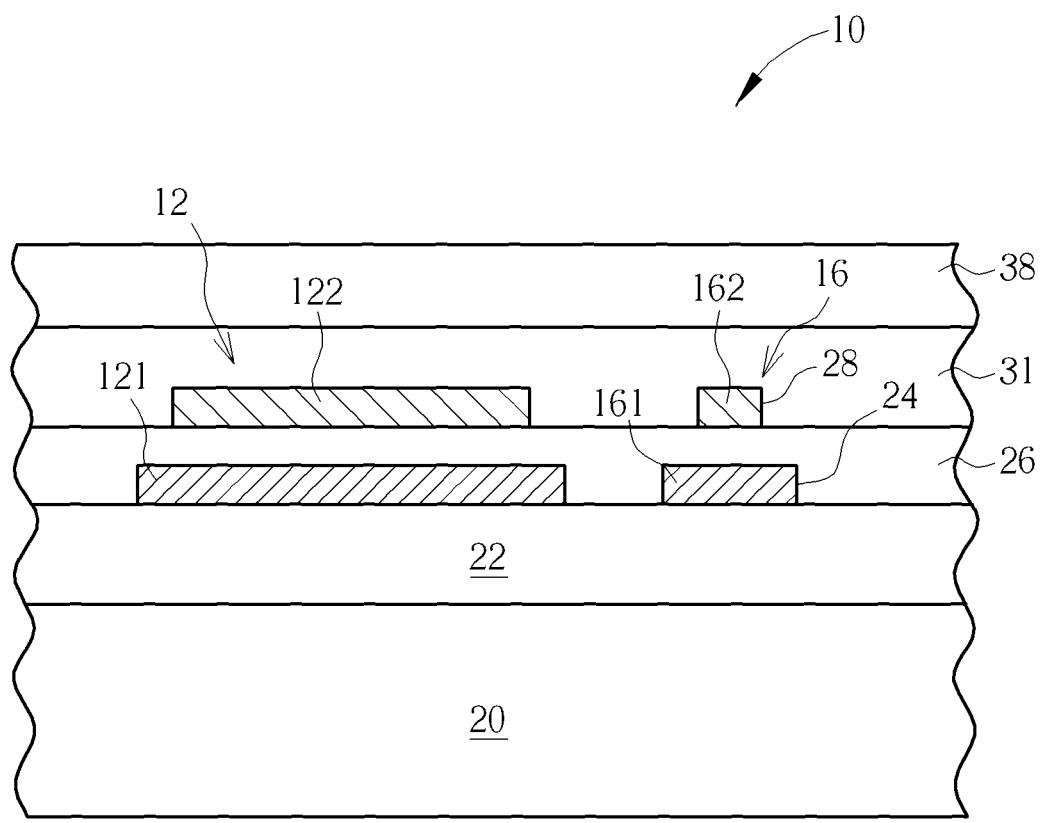
FIG. 9 is a schematic cross-sectional view of the integrated component along a cross line C-C' shown in FIG. 7.

FIG. 1a to FIG. 9 are schematic diagrams illustrating the manufacturing processes of a method for controlling the electrical property of the passive device during a fabrication of an integrated component and related integrated component structure according to a first embodiment of the present invention, wherein FIGS. 1a and 7 are schematic top views of the integrated component; FIG. 2b is a schematic cross-sectional view along the cross line A-A' shown in FIG. 1a; FIG. 3 is a schematic diagram illustrating four selections of the layout pattern corresponding to at least one later manufacturing process according to the first embodiment; FIGS. 4 and 6 illustrating the photomasks selected for the later manufacturing processes according to the first embodiment; and FIGS. 5 and 8-9 are schematic cross-sectional views of the integrated component according to the first embodiment. Please refer to FIG. 1a and FIG. 2a. Since the present invention discloses a method for controlling the electrical property of the passive device during a fabrication process of an integrated component, the following descriptions focus on the manufacturing of the passive device 12 and related manufacturing processes. During fabricating the integrated component 10, a substrate 20 is first provided, wherein the substrate 20 may represent a semiconductor substrate, such as a silicon wafer, for manufacturing various active devices, passive devices, or integrated circuits thereon. Therefore, the integrated component 10 may include many devices on the substrate 20, which are neglected and be represented by one device layer 22 formed on the substrate 20. Then, the passive device 12 is manufactured on the substrate 20. For example, the passive device 12 might be one of the devices of an integrated passive device (IPD). In this embodiment, the passive device 12 is a capacitor, such as a metal-insulator-metal (MIM) type capacitor or a metal-oxide-metal (MOM) type capacitor, but not limited thereto. However, in other embodiments, the passive device 12 may be a resistor or an inductor. An MIM type capacitor is taking as an example as the passive device 12 in this embodiment for explanation, it includes a bottom electrode 121 as a first conductive element, a top electrode 122 as a second conductive element, and an insulating layer 26 formed between the bottom electrode 121 and the top electrode 122.

According to the present invention, a plurality of sub-cells 14, 16, 18 are manufactured together with the passive device 12, wherein the sub-cells 14, 16, 18 are disposed adjacent to the passive device 12 and are used for adjusting the electrical property of the passive device 12, and all the sub-cells 14, 16, 18 have identical sizes. Each of the sub-cells 14, 16, 18 has a structure similar to the passive device 12. For example, since the passive device 12 is a MIM type capacitor in this embodiment, the sub-cells 14, 16, 18 have the structures as MIM type capacitors, too. The sub-cell 14 has a first sub-cell conductive element 141 and a second sub-cell conductive element 142, serving as the bottom electrode and the top electrode of the sub-cell 14 respectively. Similarly, the sub-cell 16 has a first sub-cell conductive element 161 and a second sub-cell conductive element 162, serving as the bottom electrode and the top electrode of the sub-cell 16 respectively, and the sub-cell 18 has a first sub-cell conductive element 161 and a second sub-cell conductive element 162, serving as the bottom electrode and the top electrode of the sub-cell 16 respectively. The first sub-cell conductive elements 141, 161, 181 and the bottom electrode 121 of the passive device 12 can be formed at the same time through the same manufacturing processes, and the second sub-cell conductive elements 142, 162, 182 can be formed together with the top electrode 122 of the passive device 12, too. For instance, when forming the first sub-cell conductive elements 141, 161, 181 and the bottom electrode 121, a first conductive layer 24 is blanketly formed on the substrate 20, such as through a deposition process, wherein the first conductive layer 24 can be a metal layer or include at least one metal material. Then, a first photolithography-etching-process (PEP) is performed to pattern the first conductive layer 24 to remove a portion of the first conductive layer 24, and the remaining portion of the first conductive layer 24 includes the bottom electrode 121 of the passive device 12 and the first sub-cell conductive elements 141, 161, 181. Accordingly, the first sub-cell conductive elements 141, 161, 181 and the bottom electrode 121 of the passive device 12 are formed with the same first conductive layer 24. Noted that the bottom electrode 121 and the first sub-cell conductive elements 141, 161, 181 should have equal potential, thus they may be electrically connected with each other through other elements not illustrated in the figure. Sequentially, the insulating layer 26 is formed on the substrate 20 to cover the bottom electrode 121 and the first sub-cell conductive elements 141, 161, 181. A second conductive layer 28 is then blanketly formed on the insulating layer 26. For example, the second conductive layer 28 can be a metal layer or include at least one metal material. A second PEP is performed to remove a portion of the second conductive layer 28 to leave the top electrode 122 and the second sub-cell conductive elements 142, 162, 182 on the insulating layer 26. Therefore, the top electrode 122 of the passive device 12 and the second sub-cell conductive elements 142, 162, 182 can be formed with the same second conductive layer 28 according to this embodiment.

Figure 1B:
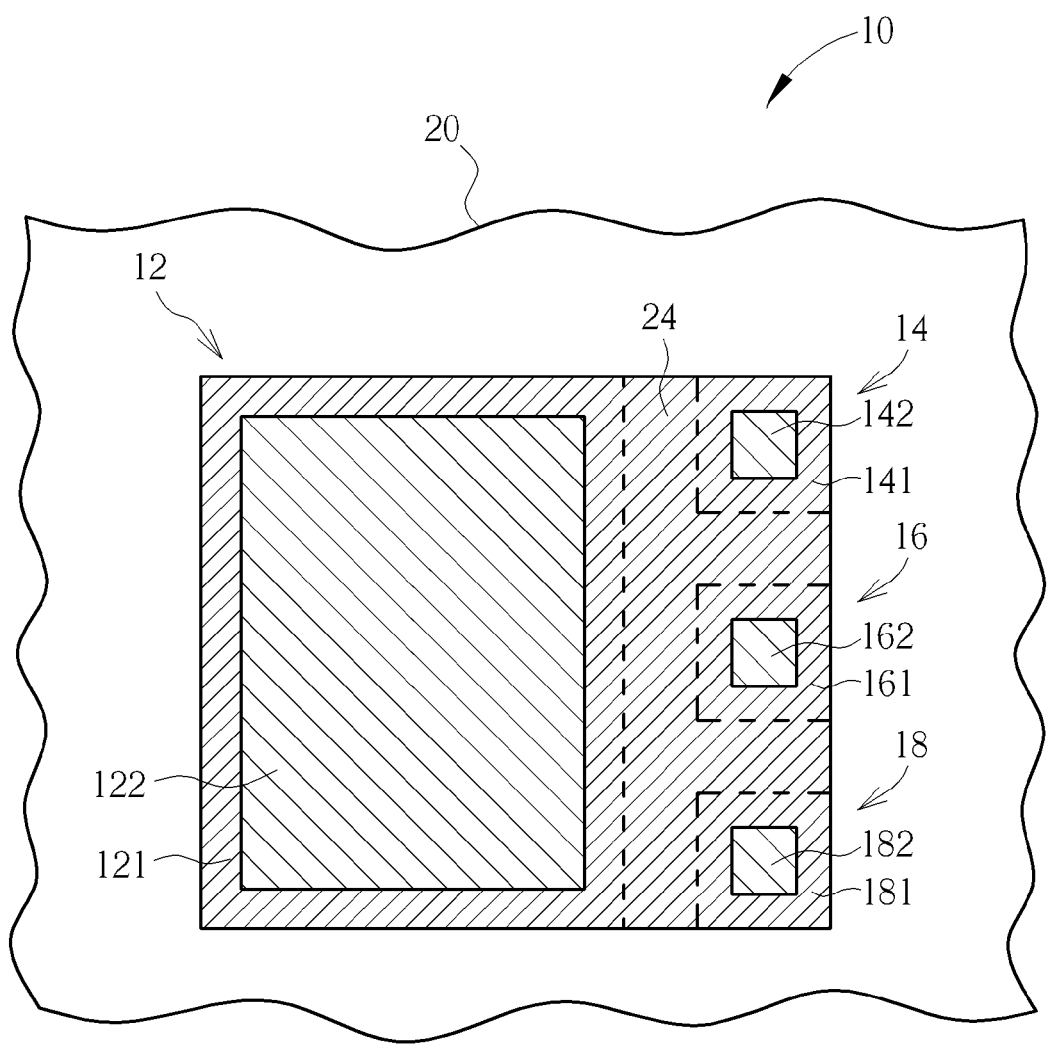
Figure 2A:
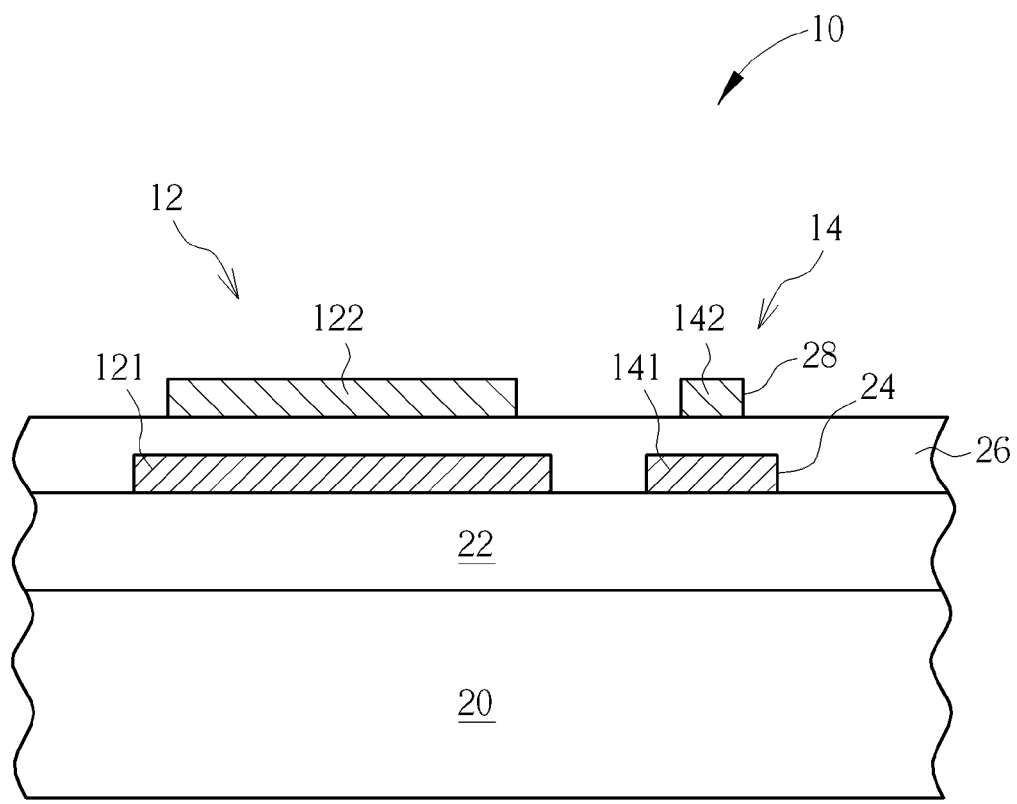
Figure 2B:
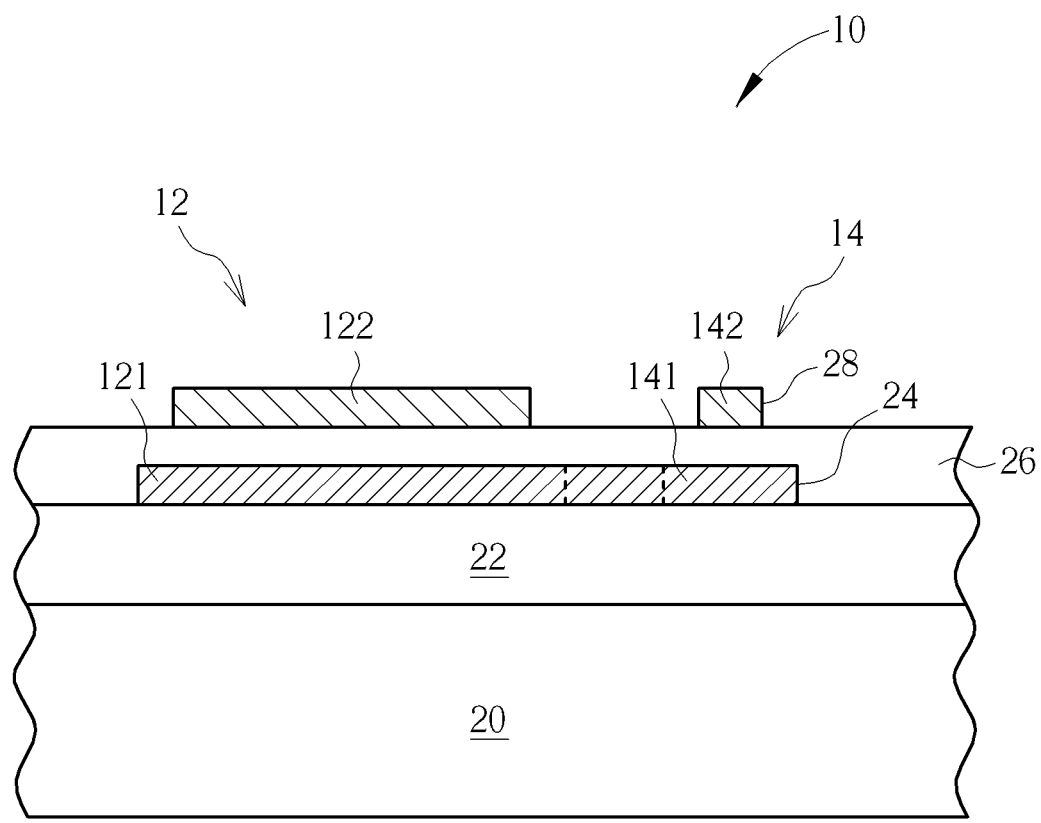
FIG. 2b is a schematic cross-sectional view along the cross line A-A' shown in FIG. 1b.

It is noteworthy that the bottom electrode 121 may directly contact with the first sub-cell conductive elements 141, 161, 181 as a whole large bottom electrode since the bottom electrode 121 and the first sub-cell conductive elements 141, 161, 181 should have equal potential. FIG. 1*b* and FIG. 2*b* respectively illustrate the variant embodiment of the present invention. In FIG. 1*b* and FIG. 2*b*, the remaining first conductive layer 24 has a large area including the areas of the bottom electrode 121 and the first sub-cell conductive elements 141, 161, 181, thus the bottom electrode 121 and the first sub-cell conductive elements 141, 161, 181 are directly contact with each other such that the bottom electrode 121 are electrically connected to the first sub-cell conductive elements 141, 161, 181 directly as they are formed with the same remaining portion of the first conductive layer 24. However, for simply explanation, the bottom electrode 121 and the first sub-cell conductive elements 141, 161, 181 are illustrated as separate electrodes (as shown in FIG. 1*a* and FIG. 2*a*) in the following figures and disclosed embodiments, while they may be actually formed with the shapes shown in FIG. 1*b* and FIG. 2*b*.

According to the first embodiment of the present invention, the whole fabrication of the integrated component 10 is paused after the manufacturing process of the passive device 12 for performing a measuring step. The main objective of the measuring step of the present invention is to find out if any process variation or any variation of the electrical property of the passive device 12 exists and to find out the variation value. In this embodiment, the measuring step includes measuring the capacitance value of the passive device 12 to obtain at least one measuring result. Then, based on the measuring result, at least one layout pattern corresponding to at least one later manufacturing process or corresponding to a next manufacturing process is determined. The theory for determining the layout pattern of the next manufacturing process is explained in the following. Since the sub-cells 14, 16, 18 have the structures similar to the passive device 12, the capacitance value of the passive device 12 can be increased if the passive device 12 is electrically connected to any one of the sub-cells 14, 16, 18 because the capacitance value is relative to the overlapped area of the top electrode and the bottom electrode of a capacitor. Therefore, the inline worker could decide how many sub-cells 14, 16, 18 should be electrically connected to the passive device 12 according to the measuring result for adjusting the electrical property of the passive device 12. As shown in FIG. 3, since there are three sub-cells 14, 16, 18 near the passive device 12, the inline worker has at least four Selections (1)-(4) of the layout pattern corresponding to at least one later manufacturing process for adjusting the capacitance value of the passive device 12. In this embodiment, the layout pattern of Selection (2) may be designed as a default layout pattern for instance. If the measuring result points out that the capacitance value of the passive device 12 is large enough, the inline worker could choose Selection (1) to electrically isolate the passive device 12 from the sub-cells 14, 16, 18, which means the next or rest manufacturing processes will not forming any connecting element to electrically connect the sub-cells 14, 16, 18 to the passive device 12; if the capacitance value is approximately near the predetermined or preferable value, the inline worker could choose Selection (2) to only electrically connect one of the sub-cells 14, 16, 18 to the passive device 12 by determining to form a connecting element 30A; if the capacitance value is a little smaller than the predetermined or preferable value, the inline worker could choose Selection (3) to electrically connect two of the sub-cells 14, 16, 18 to the passive device 12 by determining to form a connecting element 30A and a connecting element 30B; and if the capacitance value is quite smaller than the predetermined or preferable value, the inline worker could choose Selection (4) as the layout pattern corresponding to the at least one later manufacturing process to form a connecting element 30A, a connecting element 30B, and a connecting element 30C in order to electrically connect all the sub-cells 14, 16, 18 to the passive device 12.

In an embodiment, the at least one later manufacturing process could determined according to a mapping table of the electrical property, such as the capacitance value, and the relative layout pattern, which could be pre-provided. The mapping table could be prepared according to statistics or analysis of many samples of the passive device 12 and sub-cells 14, 16, 18 for example. More particularly, the mapping table includes the data of the values of the possible measuring results and the corresponding predetermined photomasks, reflecting the relative layout patterns of the later manufacturing process. Please refer to Table 1, wherein Table 1 is an example of the mapping table of the electrical property and the relative layout pattern, which may also be a mapping table with the values of the measuring results and the corresponding predetermined photomasks of the relative layout patterns. Accordingly, the inline worker could determine the following layout pattern according to the measuring result and the mapping table. Taking Table 1 as an example for explanation, the determining theory is as the following: if the measuring result reflects that the capacitance value is in the range from capacitance value C0 to capacitance value C1, choose Selection (1); if the capacitance value is in the range from capacitance value C1 to capacitance value C2, choose Selection (2); if the capacitance value is in the range from capacitance value C2 to capacitance value C3, choose Selection (3); and if the capacitance value is in the range from capacitance value C3 to capacitance value C4, choose Selection (4). Since each selection of the layout pattern means the electrical connection between the passive device 12 and the sub-cells 14, 16, 18, each selection may correspond to at least one photomask for at least one later manufacturing process. In this embodiment, each selection may correspond to a set of photomasks, which includes two or more photomasks for two or more later manufacturing processes. Therefore, in Table 1, Selection (1) corresponds to a photomask set (1); Selection (2) corresponds to a photomask set (2), and so on. In other words, the determination of the at least one layout pattern corresponding to at least one later manufacturing process includes selecting at least one photomask or a set of photomasks from a plurality of predetermined photomasks of the later manufacturing process.

TABLE 1

Mapping table of values of measuring result and corresponding photomasks

| Electrical property value range/measuring result | Selection of layout pattern of later manufacturing process | Photomask |
| --- | --- | --- |
| C0-C1 | Selection (1) | Photomask set (1) |
| C1-C2 | Selection (2) | Photomask set (2) |
| C2-C3 | Selection (3) | Photomask set (3) |
| C3-C4 | Selection (4) | Photomask set (4) |

Taking Selection (2) as an example in this embodiment, assume the inline worker decides to choose the layout pattern of Selection (2) for the at least one later manufacturing process and decide to form only one connecting element 30A for electrically connecting the passive device 12 to the sub-cell 14. Accordingly, the Photomask set (2) is selected, which includes a first photomask 38 and a second photomask 40 respectively shown in FIG. 4 and FIG. 6 for instance. Referring to FIG. 4, the connecting element 30A includes at least two contact plugs and at least one connection line, thus the first photomask 38 should define the contact holes 34 used for forming the contact plugs. In FIG. 4, the solid lines represent the layout pattern of the first photomask 38 which will be defined in a third PEP, and the broken lines represent the layout pattern of other elements which are already formed on the substrate 20. The broken lines and the solid lines show the relative positions of the predetermined contact holes 34 and the passive device 12 and the sub-cells 14, 16, 18. Referring to FIG. 5, FIG. 5 is a cross-sectional view illustrating the integrated component 10 in the following process of FIG. 2. An insulating layer 31 (or a dielectric layer) is blanketly formed on the substrate 20, and then the first photomask 38 is used for performing the third PEP to pattern the insulating layer 31, such that the contact holes 34' are formed in the insulating layer 31 on the substrate 20, exposing a portion of the top electrode 122 of the passive device 12 and a portion of the second sub-cell conductive element 142 of the sub-cell 14.

Sequentially, a third conductive layer 37 is formed on the substrate 20, wherein the third conductive layer 37 may include a metal layer or at least one metal material. For example, the contact holes 34' can be filled with the third conductive layer 37 to form contact plugs. Then, the second photomask 40 is used in a fourth PEP to define the pattern of a connecting line on the third conductive layer 37. As shown in FIG. 6, the predetermined connecting line 36 is represented by the solid lines, wherein the connecting line 36 extends over the passive device 12 and the sub-cell 14, covering the pattern of the contact holes 34. Please refer to FIG. 7 to FIG. 10, wherein FIG. 8 and FIG. 9 are schematic cross-sectional views of the integrated component 10 along the cross lines B-B' and C-C' shown in FIG. 7 respectively. After the fourth PEP, a portion of the third conductive layer 37 is removed, and the remaining portion of the third conductive layer 37 includes at least the connecting line 36'. Accordingly, the connecting element 30A is manufactured, including at least two contact plugs formed in the contact holes 34 and at least one connecting line 36'. Following that, a dielectric layer 38 may be selectively formed on the substrate 20 to cover the connecting element 30A. It is noteworthy that since no connecting element is formed between the passive device 12 and the sub-cells 16 and 18, there is no contact plug or connecting line shown in FIG. 9. As a result, the total capacitance value of the passive device 12 is raised because the total overlapped area of the top and bottom electrodes is increased, with a unit of the sub-cell 14.

The arrangement and the total number of the sub-cells and the connecting elements are not limited by the above-described embodiment. Furthermore, the passive device is not limited to capacitor. In various embodiments of the present invention, the passive device may include a resistor or an inductor, and their electrical properties, such as resistance or inductance value, could be adjusted based on the lengths, widths, sizes, or other factors of the sub-cells, but not limited thereto. In addition, in other embodiments, the at least one later manufacturing process mentioned in the first embodiment is not limited to the "next" manufacturing process of the formation of the passive device 12 during the fabrication of the integrated component. For example, other devices may be first formed on the substrate 20 before forming the connecting element 30A, or several device layers may be formed on the passive device 12 before forming the connecting element 30A. Furthermore, in various embodiments, there may be only one sub-cell formed adjacent to the passive device for adjusting the electrical property of the passive device. In such embodiments, the inline worker could simply determine whether the sub-cell should be electrically connect to the passive device or not in the later manufacturing process according to the measuring result of the electrical property of the passive device.

Figure 10:
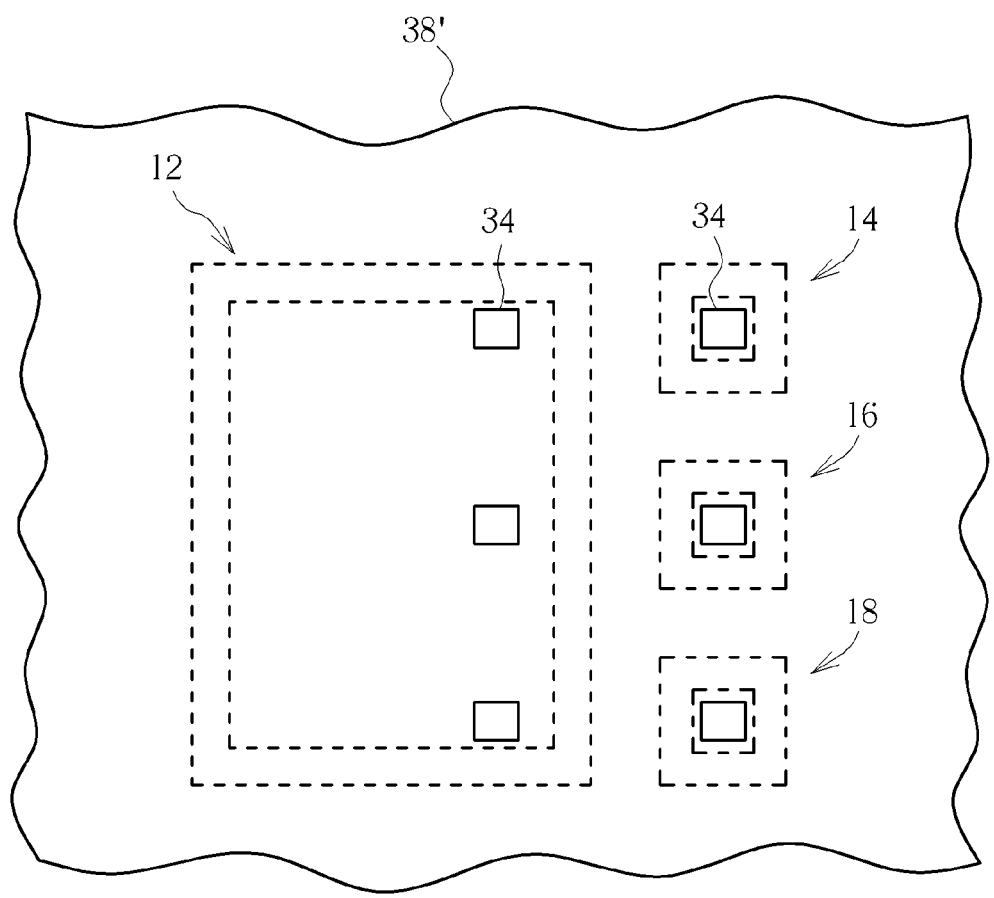
FIG. 10 is a schematic diagram illustrating a first photomask for defining the contact holes according to a second embodiment of the present invention.
Figure 11:
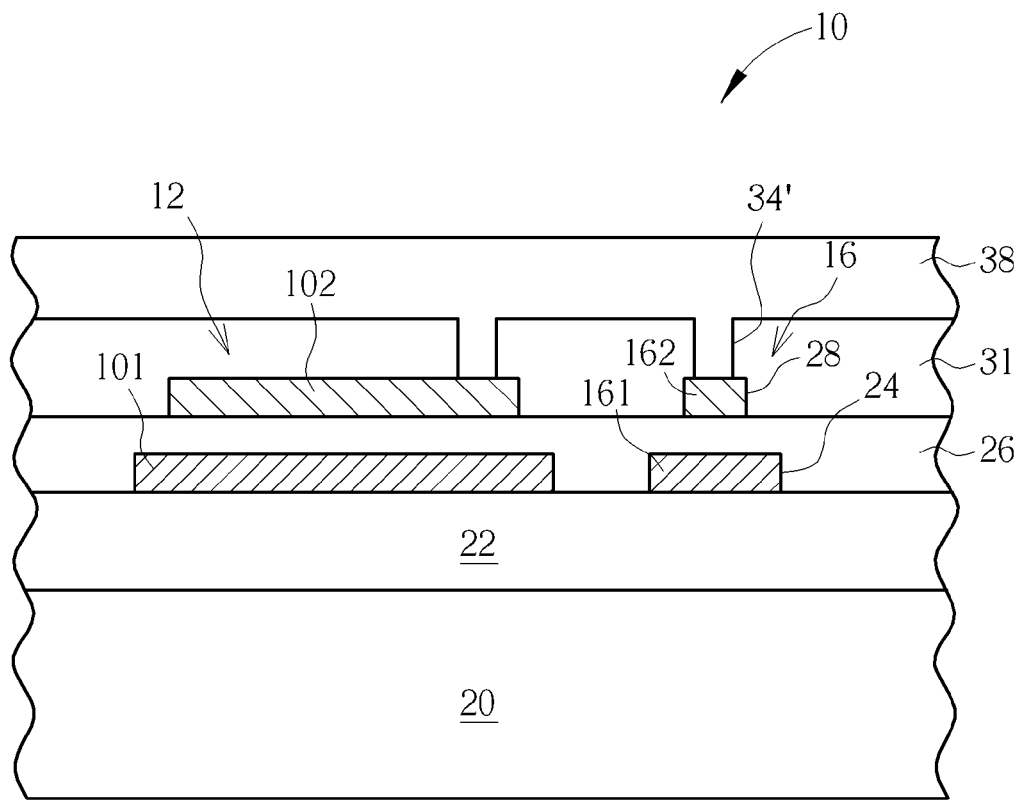
FIG. 11 is a schematic cross sectional view of the integrated component according to the second embodiment of the present invention.

Please refer to FIG. 10 and FIG. 11. FIG. 10 is a schematic diagram illustrating a first photomask for defining the contact holes according to a second embodiment of the present invention, and FIG. 11 is a schematic cross sectional view of the integrated component according to the second embodiment of the present invention. In the second embodiment of the present invention, contact holes 34 are formed on all the sub-cells 14, 16, 18 before determining the layout pattern that how many connecting elements should be manufactured. For example, the first photomask 38' may be used in the third PEP to pattern the insulating layer 31. Although not all the sub-cells 14, 16, 18 may be electrically connected to the passive device 12, the contact holes 34 could still be formed on all the sub-cells 14, 16, 18 provided that the conductive materials will be only filled into the right contact holes based on the determination of the following layout pattern. Therefore, if the inline worker decides to choose the layout pattern of Selection (2) shown in FIG. 3, the second photomask 40 can still be used to pattern the third conductive layer 37, so as to form a similar structure of the integrated component 10 shown in FIG. 7. According to the second embodiment, the cross-sectional view of the integrated component 10 along the same position of the cross-line C-C' in FIG. 7 is illustrated in FIG. 11. The dielectric layer 38 covers the dummy contact holes 34' located on the sub-cell 16. From the above description, in the second embodiment, the photomask set (2) may only include one photomask for determining the pattern of the third conductive layer 37, such as the second photomask 40 shown in FIG. 6, while the first photomask 38' can always be used for patterning the insulating layer 31 whichever Selections (1)-(4) is chosen.

Figure 12:
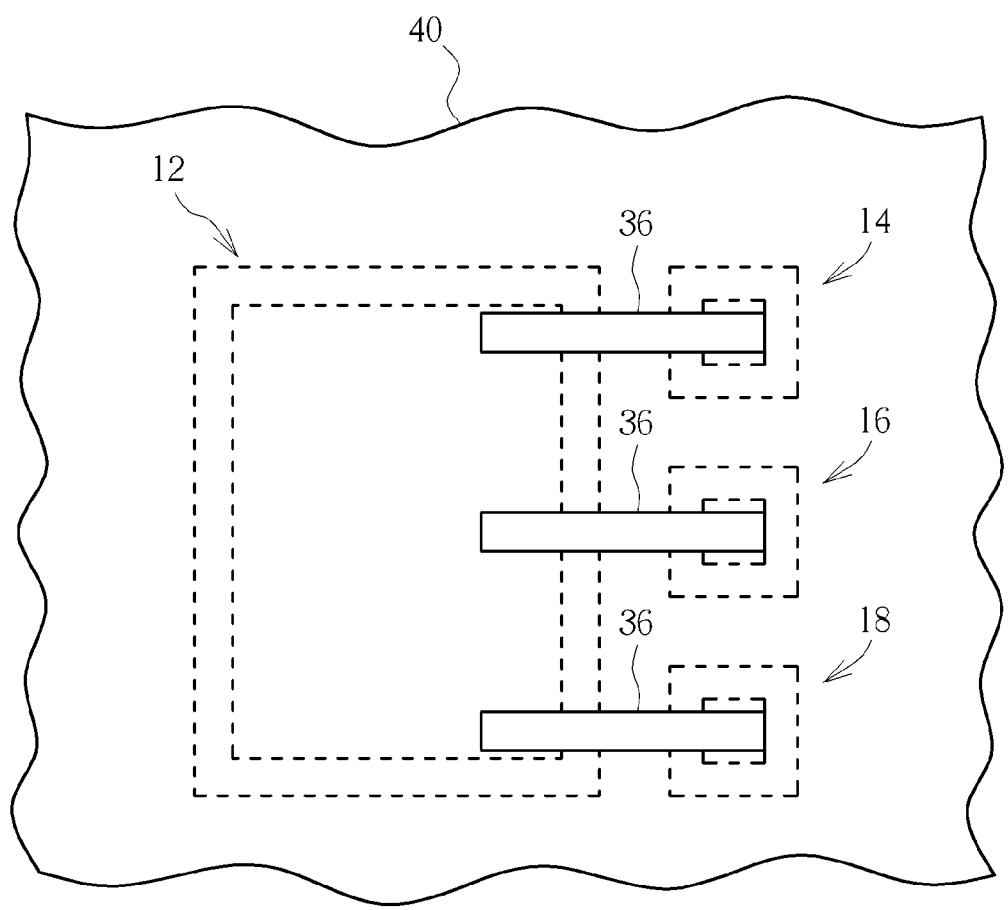
FIG. 12 is a schematic diagram illustrating a first photomask for defining the contact holes according to a third embodiment of the present invention.
Figure 13:
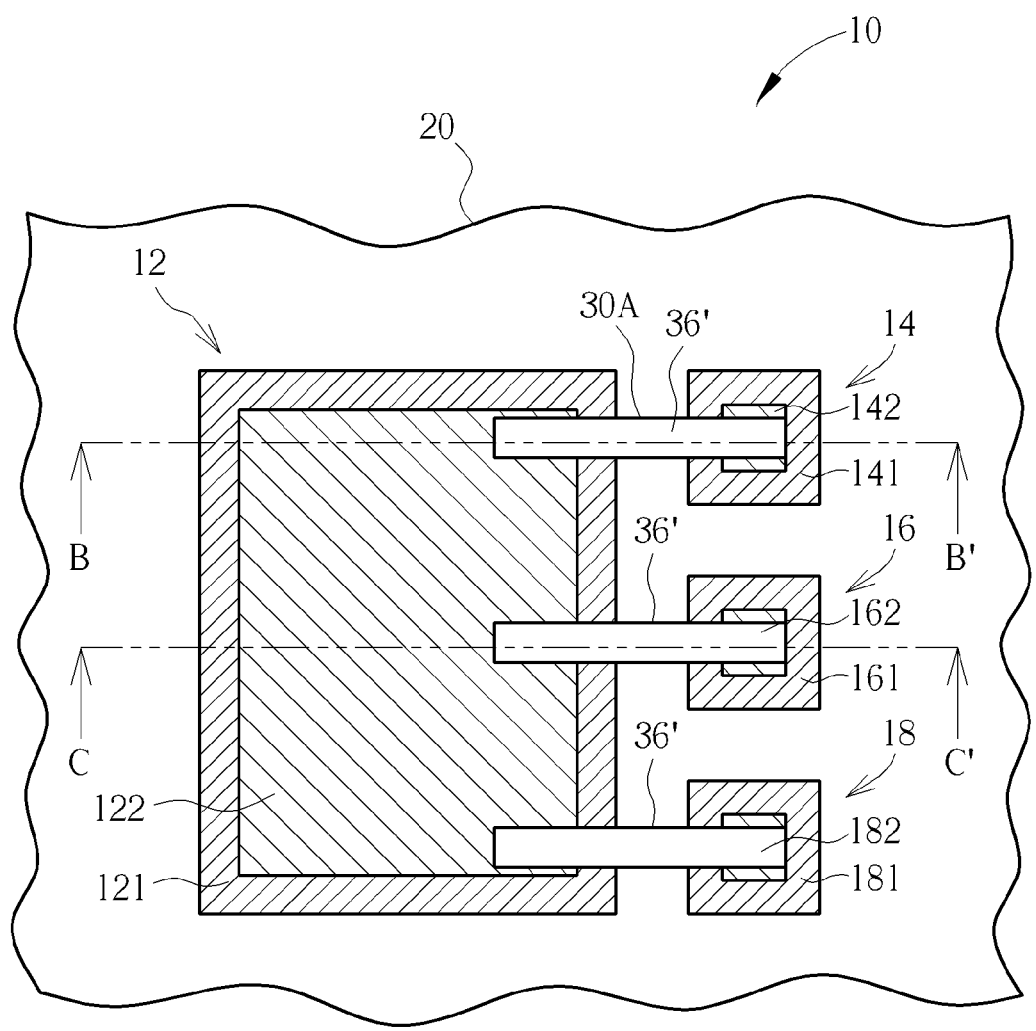
FIG. 13 is a schematic top view of the integrated component after the connecting element is manufactured according to the third embodiment
Figure 14:
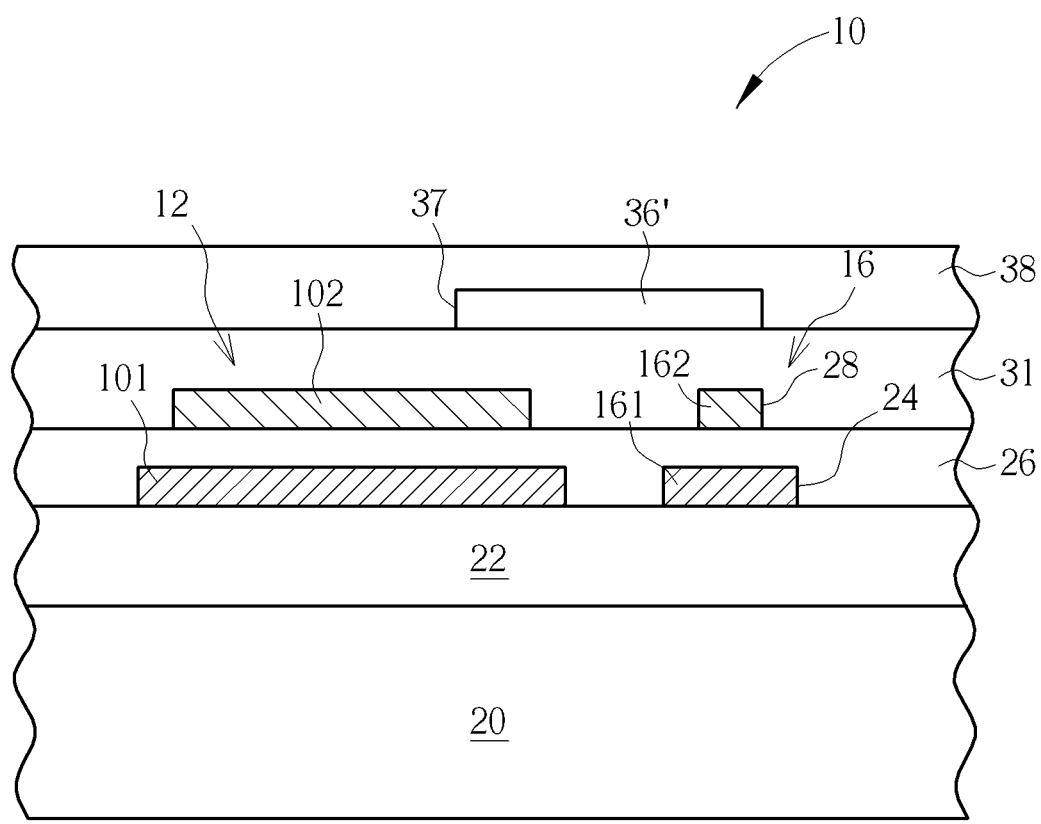
FIG. 14 is a cross-sectional view along the cross line C-C' shown in FIG. 13.

FIG. 12 to FIG. 14 illustrate the method for controlling an electrical property of a passive device according to a third embodiment of the present invention. In contrast to the second embodiment, this embodiment provides the method to only select the photomask for defining the total amount of the contact holes based on the measuring result, while the connecting lines between the passive device and the sub-cells will be always manufactured. In detailed description, following the fabrication process shown in FIG. 2a and FIG. 3 of the first embodiment, when the inline worker selects Selection (2) shown in FIG. 3, the corresponding photomask set (2) only presents the first photomask 38 for defining the contact holes 34 is selected, not including the second photomask 40 for defining the connecting lines shown in FIG. 6. Therefore, the first photomask 38 is used to form the contact holes 34 of the connecting element 30A, as shown in FIG. 5. Then, a second photomask 40' shown in FIG. 12 is used to form the connecting lines 36, wherein three connecting lines 36 will be formed. As shown in FIG. 13 and FIG. 14, FIG. 13 is the top view of the integrated component after the connecting element is manufactured according to the third embodiment of the present invention, and FIG. 14 is a schematic cross-sectional view of the integrated component along a cross line C-C' shown in FIG. 13, wherein the cross-sectional view along the cross line B-B' of FIG. 13 is similar to FIG. 8. In the third embodiment of the present invention, connecting lines 36' are formed between all the sub-cells 14, 16, 18 and the passive device 12 while only two contact holes 34' are formed, one is on the passive device and the other one is located between the sub-cell 14 and one connecting line 36. As a result, the only the second sub-cell conductive element 142 is electrically connected to the top electrode 122 of the passive device 12 through the connecting element 30A. The connecting lines 36' between the sub-cells 16, 18 and the passive device 12 do not electrically connect the sub-cells 16, 18 to the passive device 12 because there is no contact hole or contact plug between the connecting lines 36' and the second sub-cell conductive elements 162, 182. Accordingly, although not all the sub-cells 14, 16, 18 may be electrically connected to the passive device 12, the contacting lines 36' could still be formed between all the sub-cells 14, 16, 18 and the passive device 12 provided that only the required contact holes 34' are formed based on the determination of the following layout pattern. From the above description, in the third embodiment, the photomask set (2) may only include one photomask for determining the number and location of the contact holes 34', such as the first photomask 38 shown in FIG. 4, while the second photomask 40' can always be used for forming the connecting lines 36' whichever Selections (1)-(4) is chosen.

Figure 15:
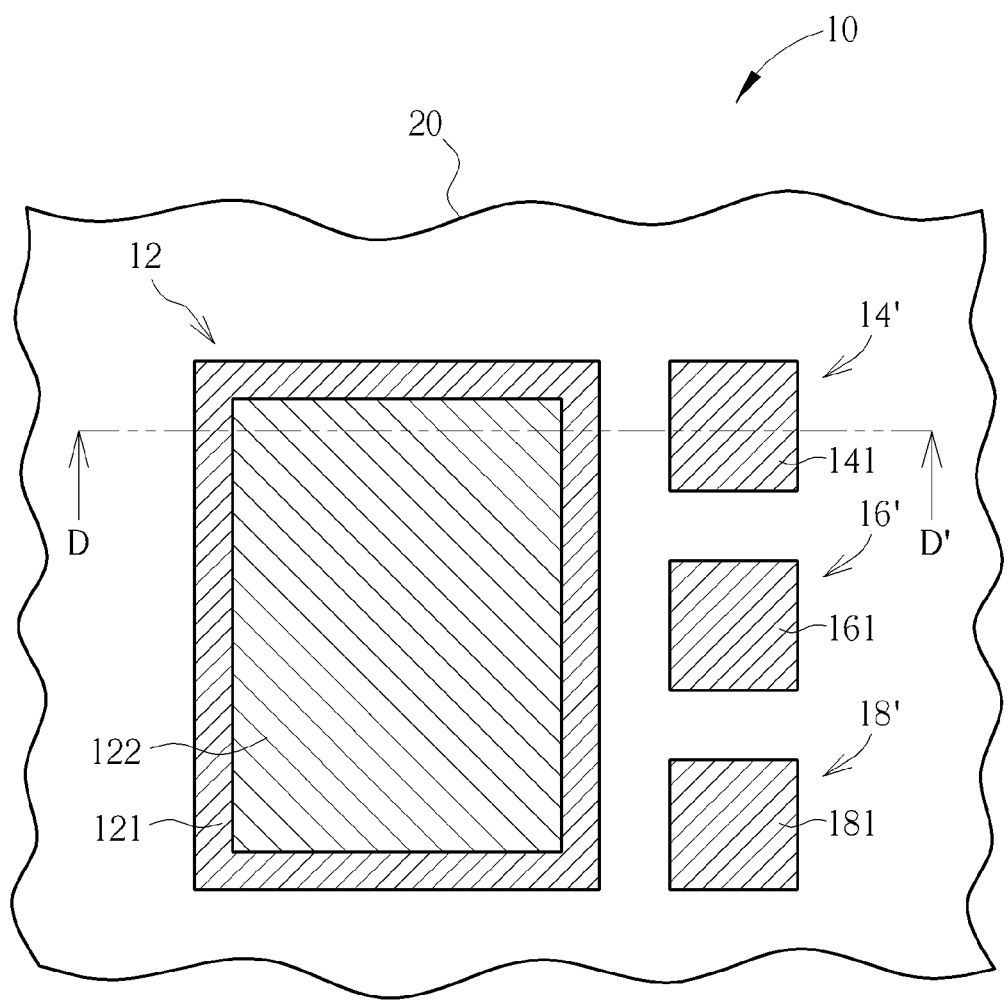
FIG. 15 is a schematic top view of an integrated component after the passive device is formed according to a fourth embodiment of the present invention.
Figure 16:
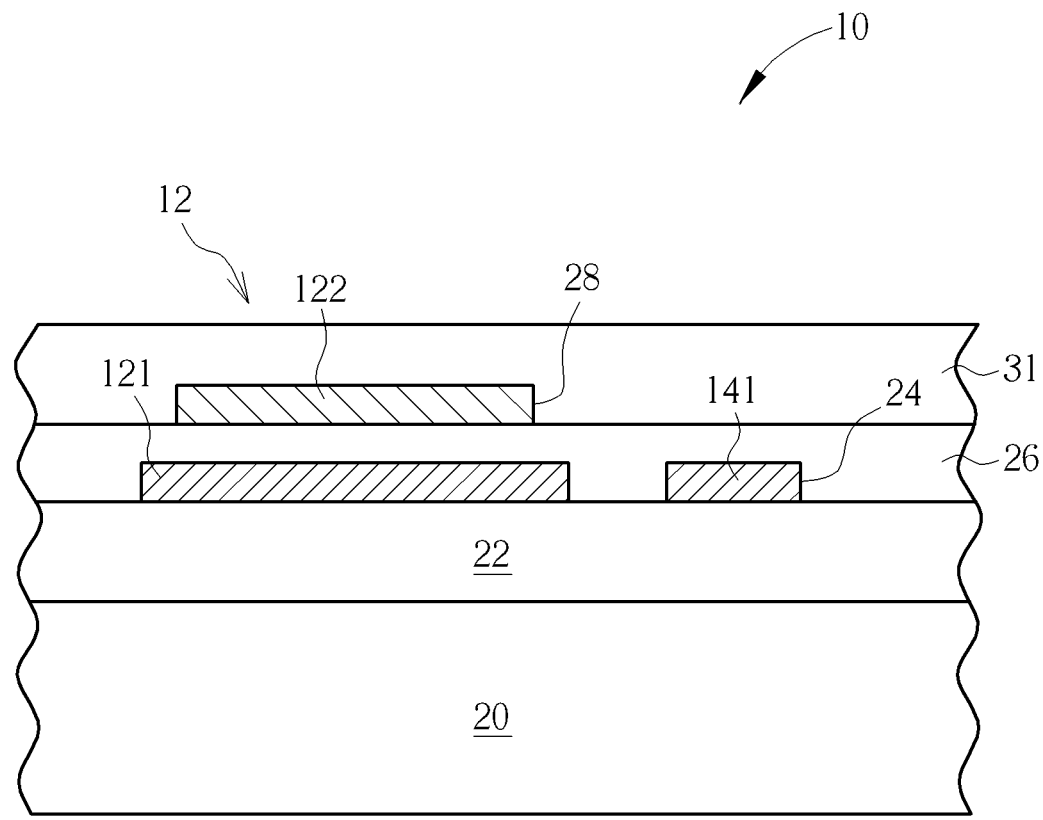
FIG. 16 is a cross-sectional view along the cross line D-D' shown in FIG. 12.
Figure 17:
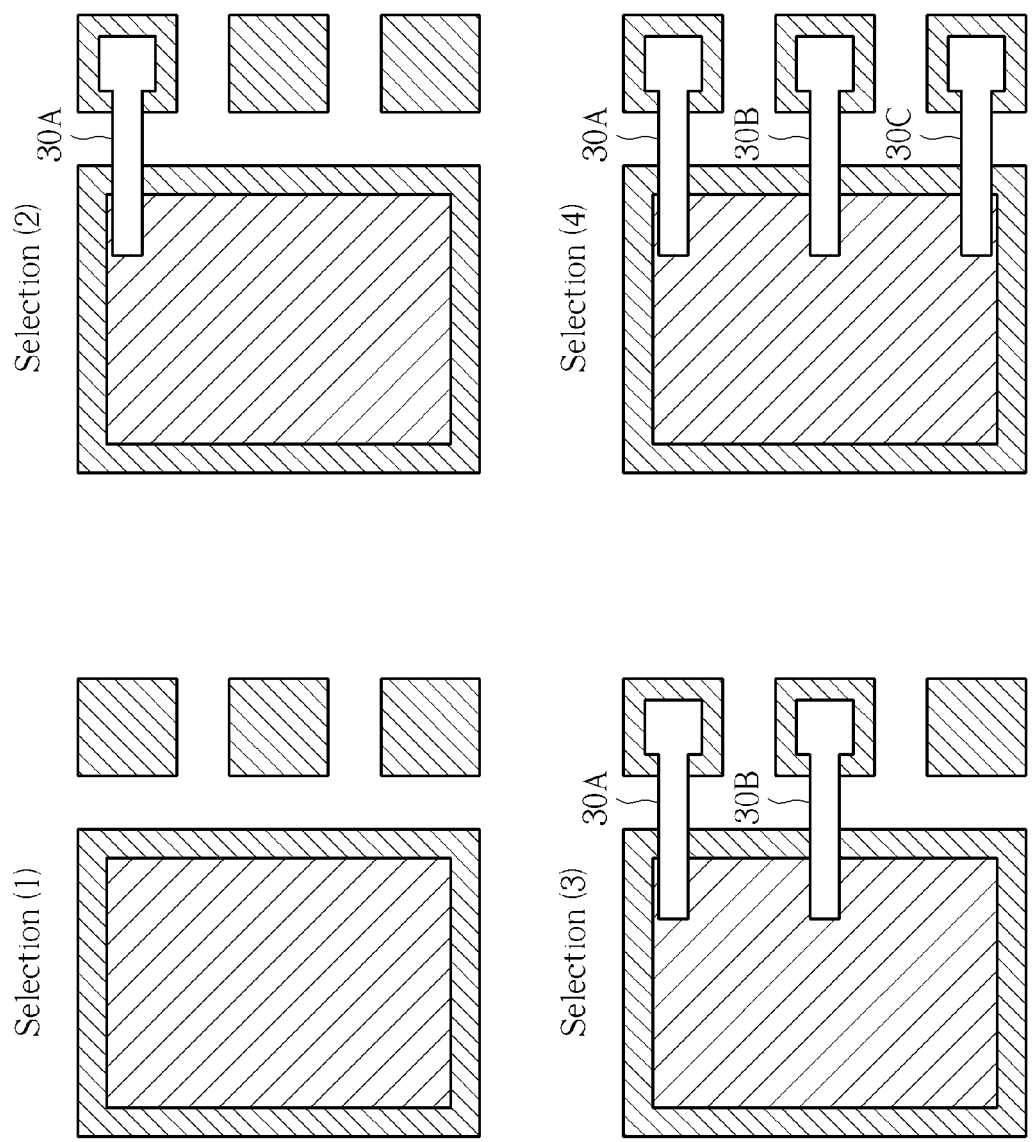
FIG. 17 is a schematic diagram illustrating four selections of the layout pattern corresponding to at least one later manufacturing process according to the fourth embodiment of the present invention.

Please refer to FIGS. 15-19. FIGS. 15-19 are schematic diagrams illustrating the method for controlling an electrical property of a passive device during fabrication of an integrated component and the related structure of the integrated component according to a fourth embodiment of the present invention. Different from the previous embodiments, the sub-cells may not include the second sub-cell conductive elements when forming the first conductive element of the passive device, such as the bottom electrode of a capacitor. As shown in FIG. 15 and FIG. 16, FIG. 15 illustrates the schematic top view of the integrated component 10 after the passive device 12 is manufactured on the substrate 20, which is a semiconductor substrate or a wafer, according to the fourth embodiment, and FIG. 16 is a cross-sectional view along the cross line D-D' shown in FIG. 15. After the second PEP, the patterned second conductive layer 28 only includes the top electrode 102 of the passive device 12, not including the second sub-cell conductive elements on the first sub-cell conductive elements 141, 161, 16 in the fourth embodiment. After forming the insulating layer 31 that covers the passive device 12, the fabrication of the integrated component 10 is paused or stopped to measure the electrical property of the formed passive device 12. Then, the inline worker may determine the following layout pattern according to the measuring result of the electrical property of the passive device 12 and a mapping table of the electrical property and the relative selection. Referring to FIG. 17, the inline worker may select the layout pattern corresponding to at least one later manufacturing process from at least four Selections (1)-(4). Selection (1) represents that there is no electrical connection between the sub-cells 14', 16', 18' and the passive device 12 and no electrical connection will be formed between the sub-cells 14', 16', 18' and the passive device 12; Selection (2) represents that only one connecting element 30A will be formed between the passive device 12 and the sub-cell 14'; Selection (3) represents that two connecting elements 30A and 30B will be formed between the passive device 12 and the sub-cells 14', 16'; and Selection (4) represents that three connecting elements 30A, 30B, 30C will be formed between the passive device 12 and the sub-cells 14', 16', 18', which will increase the total capacitance value of the passive device 12 with a relatively great value.

Figure 18:
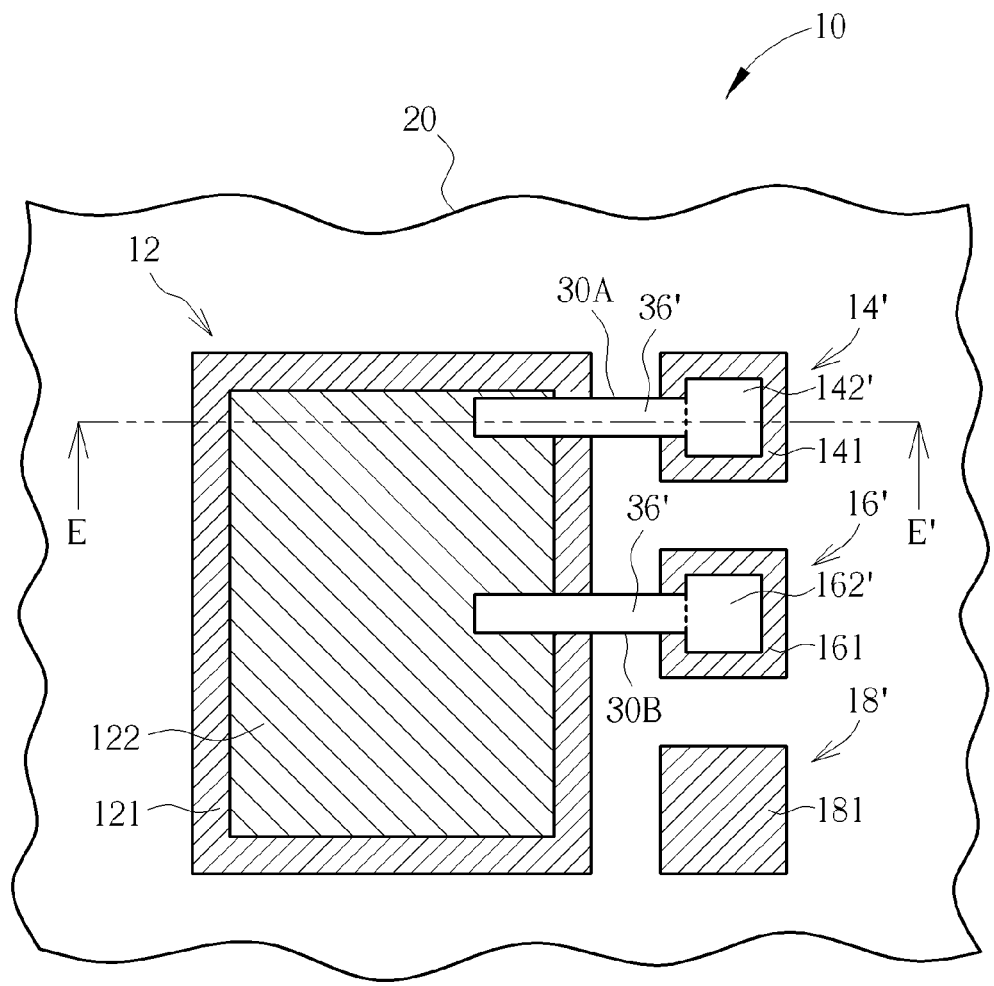
FIG. 18 is a schematic top view of the integrated component after the connecting elements are formed according to the fourth embodiment of the present invention.
Figure 19:
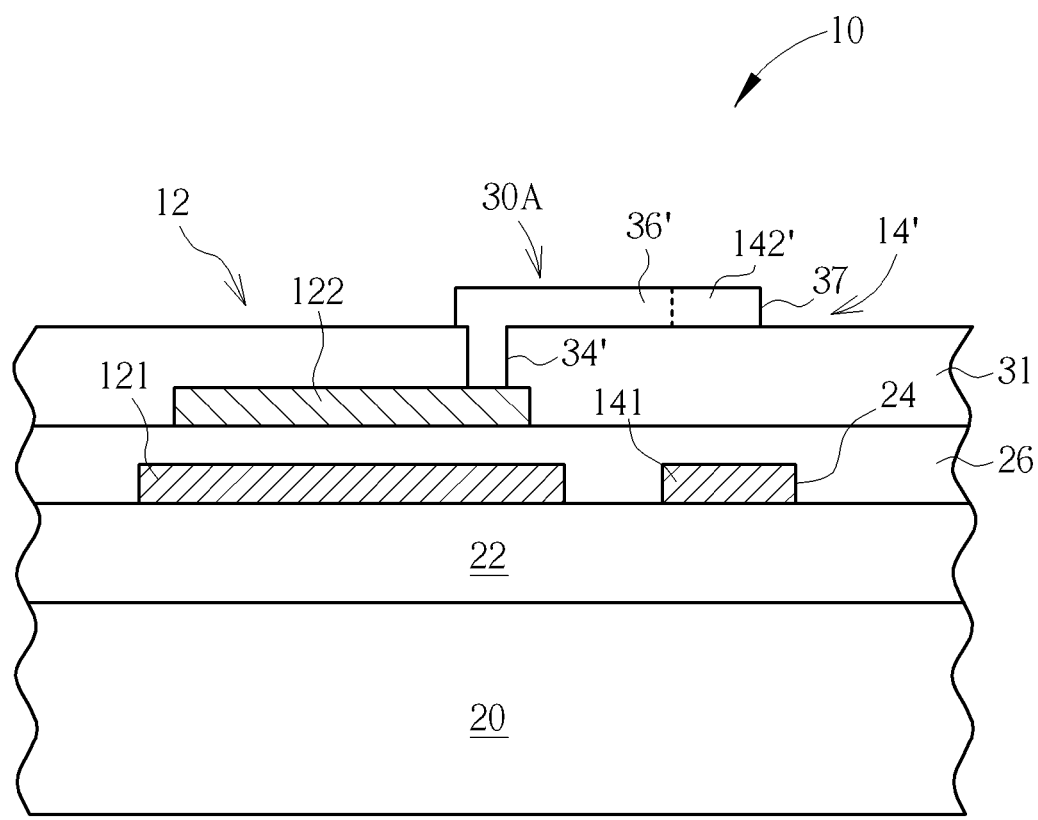
FIG. 19 is a schematic cross-sectional view according to the sectional line E-E' shown in FIG. 15.

Please refer to FIG. 18 and FIG. 19, wherein FIG. 19 is a schematic cross-sectional view according to the sectional line E-E' shown in FIG. 18. In this embodiment, assume Selection (3) is selected in the following manufacturing processes for example. Therefore, two connecting elements 30A, 30B are formed on the substrate 20, which is a semiconductor substrate or a wafer for example. The patterned third conductive layer 37 includes at least two contact plugs formed in the contact holes 34, two connecting lines 36' extends from the passive device 12 to the sub-cell 14' and the sub-cell 16', a second sub-cell conductive element 142', and a second sub-cell conductive element 162'. It is noteworthy that the second sub-cell conductive elements 142' and 162' are formed with the third conductive layer 37. In this embodiment, the first sub-cell conductive element 141, the second sub-cell conductive element 142', and the insulating layers 26 and 31 disposed therebetween form a first sub capacitor of the passive device 12, wherein the first sub-cell conductive element 141 and the second sub-cell conductive element 142' serve as a bottom electrode and a top electrode of the first sub capacitor respectively. Similarly, the first sub-cell conductive element 161, the second sub-cell conductive element 162', and the insulating layers 26 and 31 disposed therebetween form a second sub capacitor of the passive device 12, wherein the first sub-cell conductive element 161 and the second sub-cell conductive element 162' serve as a bottom electrode and a top electrode of the second sub capacitor respectively. Accordingly, the additional capacitance value is based on the overlapped area of the second sub-cell conductive element 142' and the first sub-cell conductive element 141, the overlapped area of the second sub-cell conductive element 162' and the first sub-cell conductive element 161, and the total thickness of the insulating layers 26 and 31 disposed between the first conductive layer 24 and the third conductive layer 37. After that, the rest of the fabrication of the integrated component 10 can be continued for further manufacturing other devices on the passive device 12.

Figure 20:
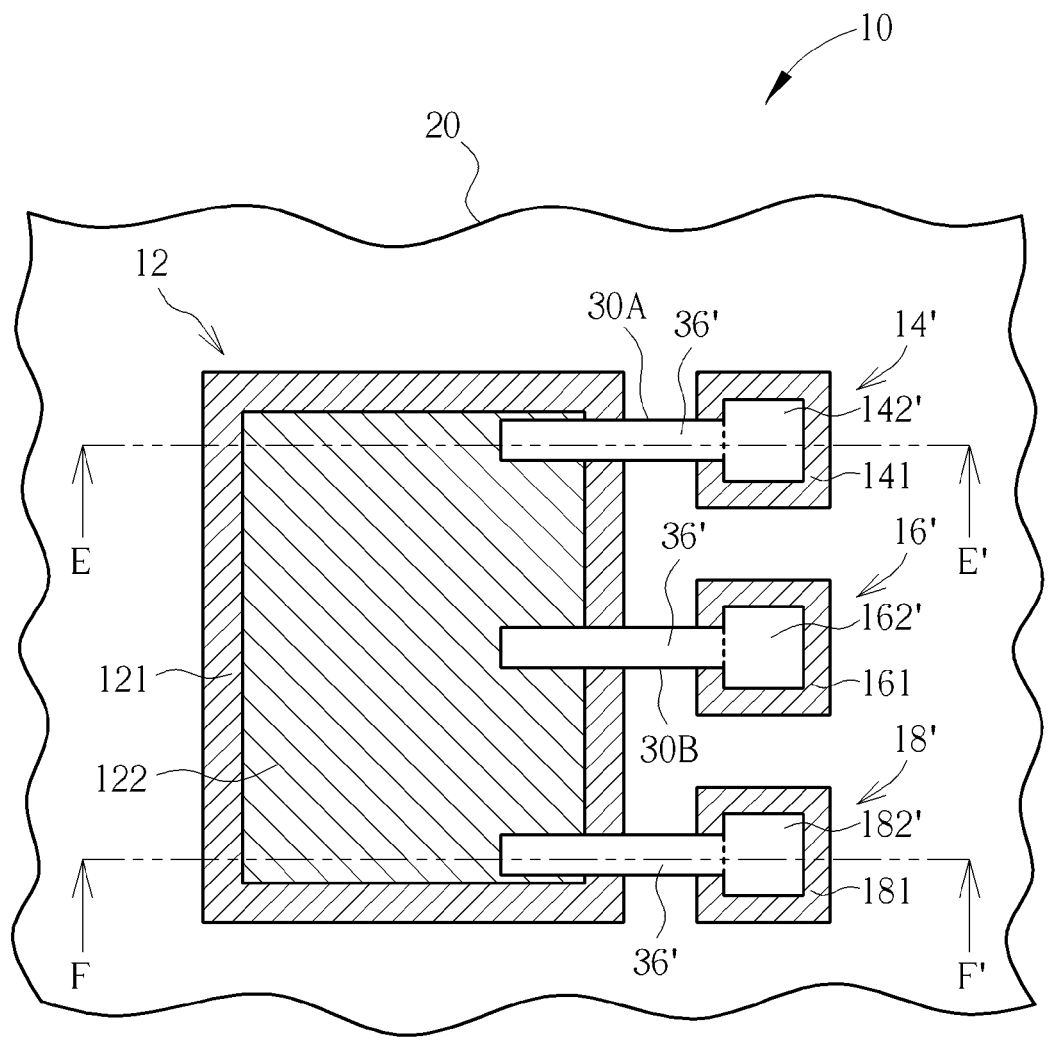
FIG. 20 is a schematic top view of the integrated component after the connecting element is manufactured according to a first variant embodiment of the fourth embodiment.
Figure 21:
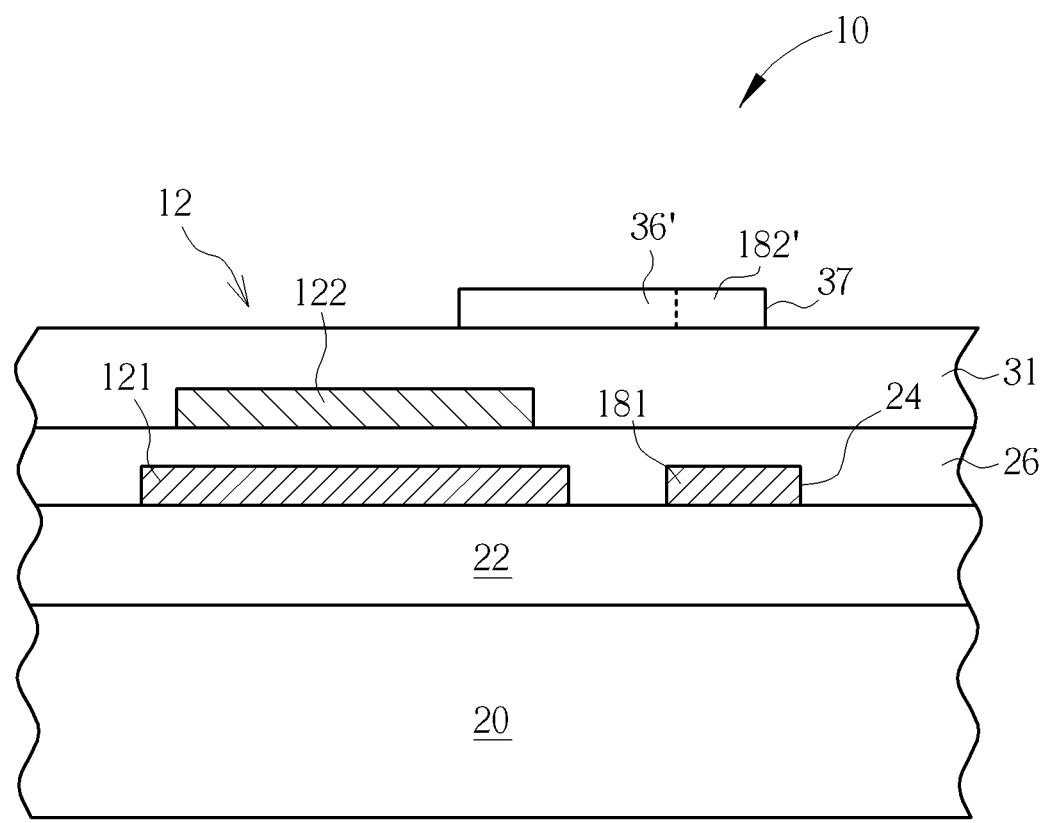
FIG. 21 is a schematic cross-sectional view according to the sectional line F-F' shown in FIG. 20.

Similar to previous embodiments, the Selections (1) to (4) shown in FIG. 14 may correspond to only one photomask respectively, each of which represents the definition of either the contact hole or the connecting line. If the corresponding photomask represents the definition of the number of the contact holes, the photomask for defining the connecting lines may be fixed to form all three connecting lines whichever the selection is chosen. In contrast, if the corresponding photomask represents the definition of the number of the connecting lines which will be manufactured, the photomask for defining the contact holes may be fixed to form all contact holes on the first sub-cell conductive elements 141, 161, 181. Please refer to FIG. 20 and FIG. 21. FIG. 20 is a schematic top view of the integrated component after the connecting element is manufactured according to a first variant embodiment of the fourth embodiment, and FIG. 21 is a schematic cross-sectional view according to the sectional line F-F' shown in FIG. 20, wherein the cross-sectional view along the sectional line E-E' of FIG. 20 is similar to FIG. 19. In this variant embodiment, the photomask for defining the pattern of the connecting lines is fixed, which means all the connecting lines between the three sub-cells and the passive device will be manufactured. Assume Selection (3) is selected in the following manufacturing processes for example, and therefore two connecting elements 30A, 30B should be formed on the substrate 20 and the connecting element 30C of Selection (4) in FIG. 14 should not be formed. As shown in FIG. 20, all three connecting lines 36' are manufactured while the contact holes 34' located on the first sub-cell conductive elements 141, 161 are manufactured in this variant embodiment. As shown in FIG. 21, the second sub-cell conductive element 182' and the connecting line 36' are still manufactured on the insulating layer 31 but no contact holes are formed between the second sub-cell conductive element 182' and the first sub-cell conductive element 181 in the insulating layer 31, thus the connecting element 30C shown in FIG. 14 is not formed. Accordingly, only the sub-cells 14' and 16' are electrically connected to the passive device 12. In this variant embodiment, since no extra photomasks for defining different numbers of connecting lines are needed, the cost of photomasks can be saved in comparison with the fourth embodiment of the present invention.

Figure 22:
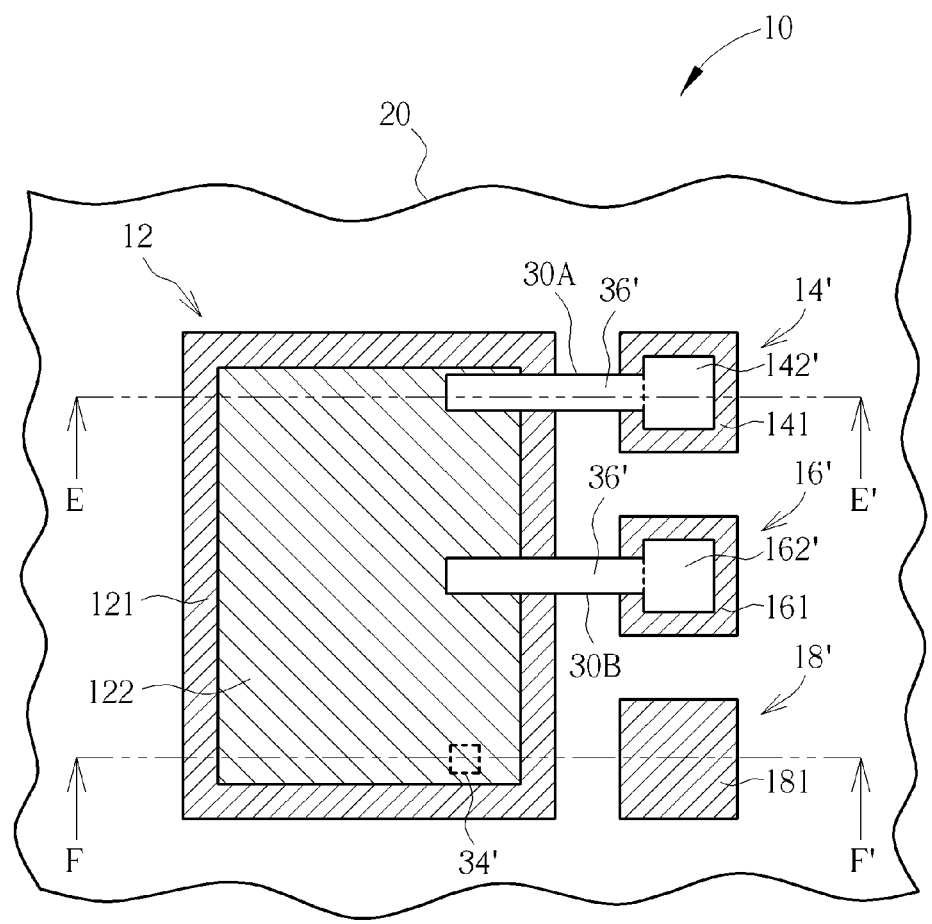
FIG. 22 is a schematic top view of the integrated component after the connecting element is manufactured according to a second variant embodiment of the fourth embodiment.
Figure 23:
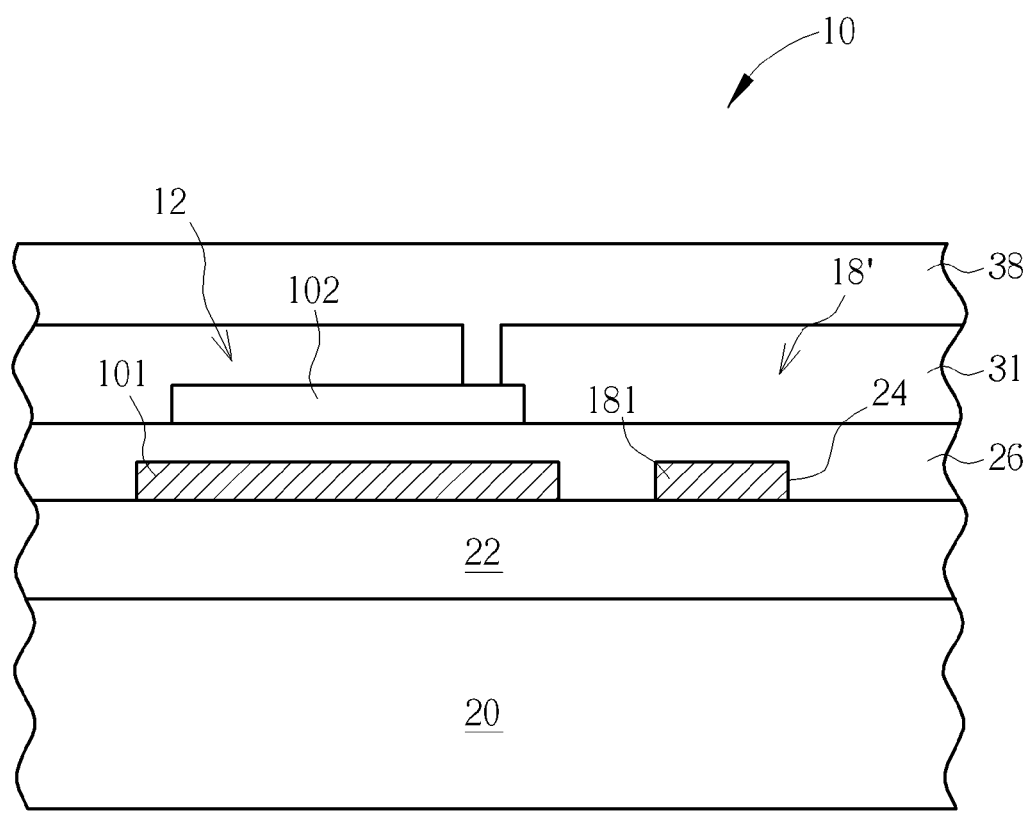
FIG. 23 is a schematic cross-sectional view according to the sectional line F-F' shown in FIG. 22.

Please refer to FIG. 22 and FIG. 23. FIG. 22 is a schematic top view of the integrated component after the connecting element is manufactured according to a second variant embodiment of the fourth embodiment, and FIG. 23 is a schematic cross-sectional view according to the sectional line F-F' shown in FIG. 22, wherein the cross-sectional view along the sectional line E-E' of FIG. 22 is similar to FIG. 19. In this variant embodiment, the photomask for defining the contact holes is fixed, which means all the contact holes on the passive device 12 corresponding to the sub-cells 12, 16, 18 will be manufactured. Assume Selection (3) is selected in the following manufacturing processes for example, and therefore only the connecting elements 30A, 30B should be formed on the substrate 20. Since the photomask for defining the contact holes is fixed, three contact holes on the passive device 12 corresponding to the sub-cells 14, 16, 18 are manufactured while only the connecting lines 36' between the sub-cells 14, 16 and the passive device 12 are manufactured in this variant embodiment. As shown in FIG. 23, the contact hole 34' located on pass device 12 corresponding to the sub-cell 18 is not filled with any conductive material or electrically connected to any connecting line, therefore the connecting element 30B shown in FIG. 14 is not formed. Only the sub-cells 14' and 16' are electrically connected to the passive device 12. In this variant embodiment, since no extra photomasks for defining different numbers of contact holes are needed, the cost of photomasks can also be saved in comparison with the fourth embodiment of the present invention.

Figure 24:
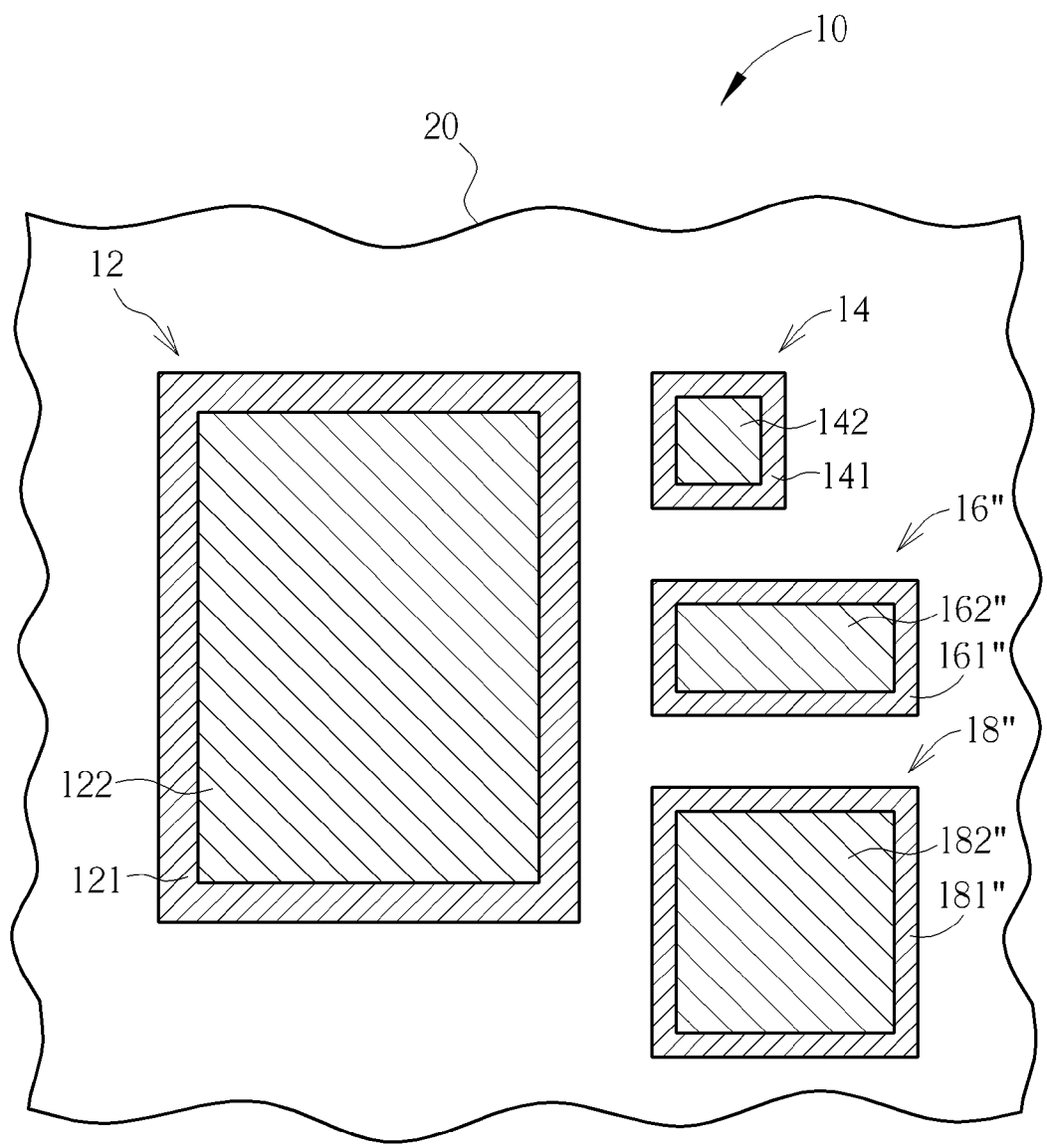
FIGS. 24-25 are schematic diagrams depict the method for controlling the electrical property of the passive device during fabrication of an integrated component according to a fifth embodiment of the present invention.
Figure 25:
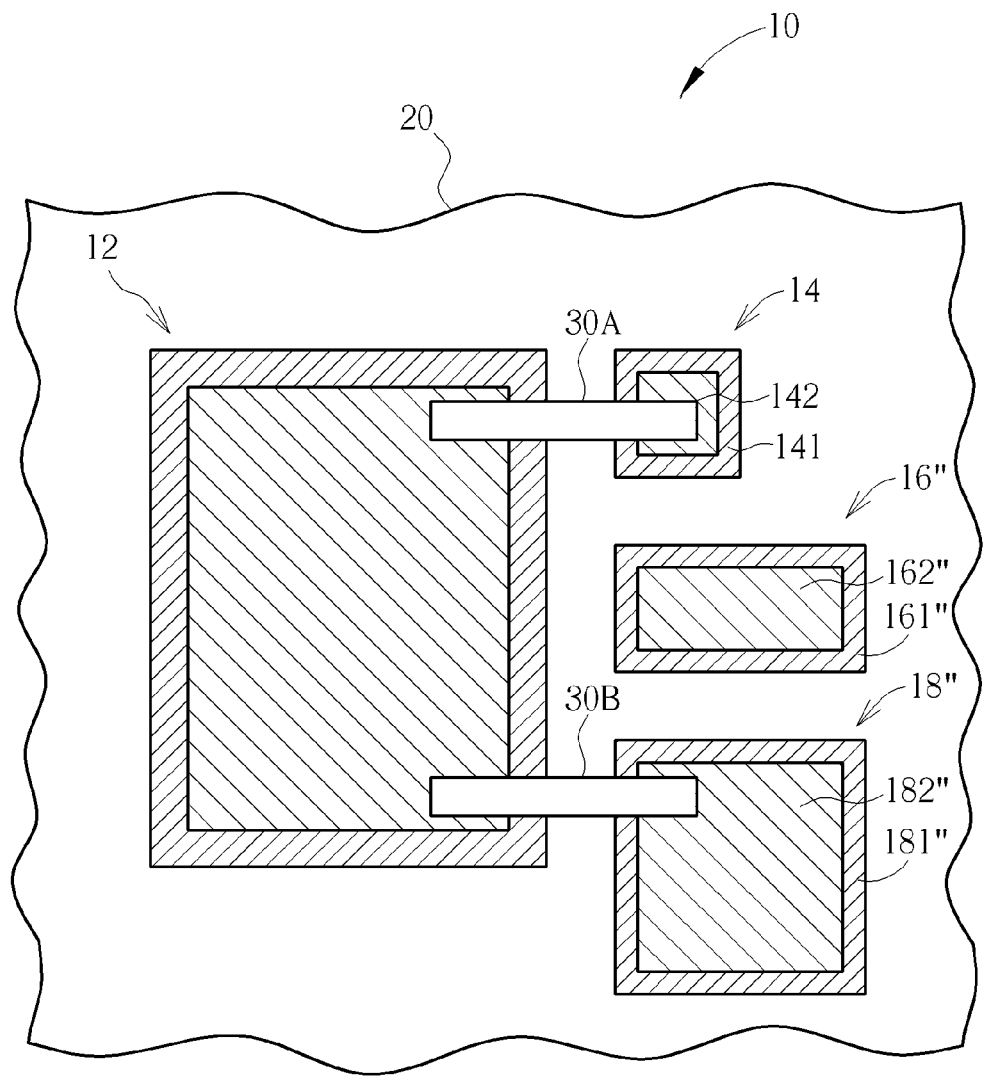

Please refer to FIGS. 24-25, wherein FIGS. 24-25 are schematic diagrams illustrating the method for controlling the electrical property of the passive device in a fabrication of an integrated component according to a fifth embodiment of the present invention. In this embodiment, a binary multiple theory is used for controlling the electrical property of the passive device. As shown in FIG. 24, the sub-cells 14, 16", 18" and the passive device 12 are manufactured simultaneously according to the present invention. However, the sizes, such as the areas, of the sub-cells 14, 16", 18" are not identical. For example, the overlapped area of the first sub-cell conductive element 161" and the second sub-cell conductive element 162" is as twice as the overlapped area of the first sub-cell conductive element 141 and the second sub-cell conductive element 142, and the overlapped area of the first sub-cell conductive element 181" and the second sub-cell conductive element 182" is as twice as the overlapped area of the first sub-cell conductive element 161" and the second sub-cell conductive element 162". Therefore, if the capacitance of the passive device 12 needs to be raised with one unit, the inline worker could determine to manufacture one connecting element for electrically connecting the passive device 12 to the sub-cell 14; if the capacitance needs to be raised with two units, the inline worker could determine still one connecting element to be manufactured for electrically connecting the passive device 12 and the sub-cell 16"; if the capacitance needs to be raised with three units, the inline worker could determine to manufacture two connecting elements for electrically connecting the passive device 12 to the sub-cells 14 and 16" respectively; and if the capacitance needs to be raised with four units, the inline worker could determine to manufacture one connecting element for electrically connecting the passive device 12 to the sub-cell 18" respectively, for example.

Referring to FIG. 25, after manufacturing the passive device 12 and the sub-cells 14, 16", 18", the fabrication is paused or stopped temporarily, for measuring the electrical property of the passive device 12 to realize the process variation, in order to determine the following layout pattern. In this embodiment, assume the capacitance value of the passive device 12 needs to be raised with five units for maintaining the electrical property in a preferable value, thus two connecting elements 30A and 30C are determined to be manufactured for electrically connecting the passive device 12 with the sub-cell 14 and the sub-cell 18" respectively. Accordingly, a corresponding photomask or a correspond set of photomasks (not shown) are adopted for manufacturing the connecting elements 30A and 30C. Therefore, the total capacitance value of the passive device 12 is adjusted according to the present invention. However, the arrangement, relative areas, and amounts of the sub-cells may be various and are not limited to this embodiment.

Figure 26:
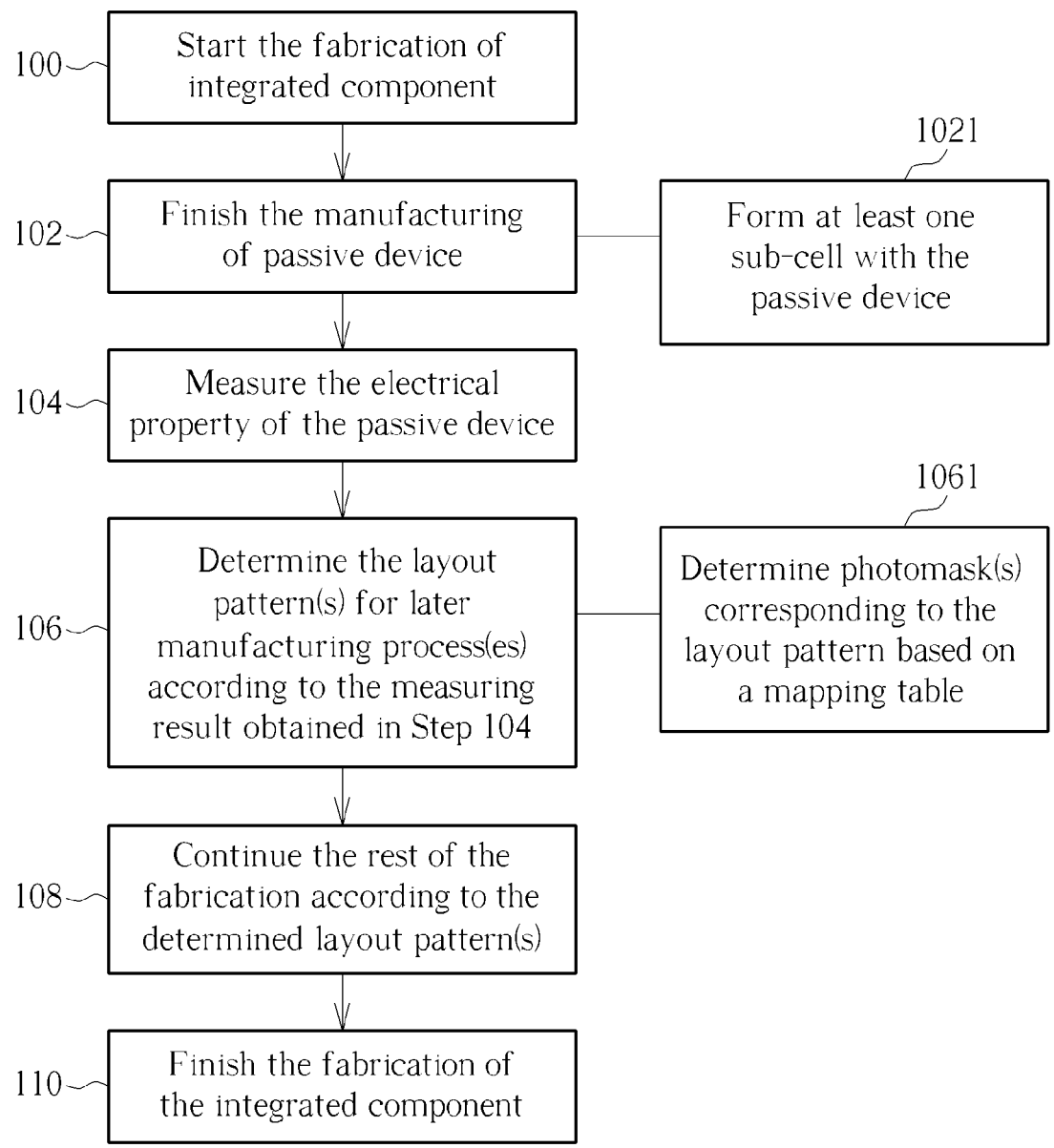
FIG. 26 illustrates a flow diagram of a method for controlling the electrical property of a passive device during fabrication of an integrated component according to the present invention.

Please refer to FIG. 26. FIG. 26 illustrates a flow diagram of the method for controlling the electrical property of a passive device during fabrication of an integrated component according to the present invention. The method of the present invention can be summarized as the following:

Step 100: Start the fabrication of the integrated component. The integrated component may include active or passive devices or various integrated devices. For example, a wafer or a semiconductor substrate for fabricating the integrated devices is provided first.

Step 102: Finish the manufacturing of a passive device whose electrical property or process variation is predetermined to be controlled. Wherein, at least one sub-cell for adjusting the electrical property of the passive device may be manufactured along with the passive device in an embodiment. In other words, the passive device and the at least one sub-cell can be manufactured simultaneously (Step 1021). In other embodiment, the at least one sub-cell can be manufactured by another formation step, not along with the passive device, provided that the sub-cell is formed before Step 106. In another embodiment, the at least one sub-cell is disposed adjacent to the passive device. In a further embodiment, a plurality of sub-cells is manufactured adjacent to the passive device at the same time.

Step 104: Measure the electrical property of the passive device to obtain at least one measuring result. During the measuring, the fabrication of the integrated component is selectively paused or stopped.

Step 106: Determine at least one layout pattern corresponding to at least one later manufacturing process for adjusting the electrical property of the passive device according to the measuring result obtained in Step 104. Step 106 may include a selective step 1061.

Selective Step 1061: The determination of the at least one layout pattern corresponding to at least one later manufacturing process may be performed according to a mapping table, wherein the mapping table includes the values of the electrical property or measuring result and the corresponding predetermined photomask(s), reflecting the relative layout pattern(s) of the later manufacturing process(es). In other words, the at least one layout pattern or the photomask(s) of the at least one later manufacturing process is determined based on both the measuring result obtained in Step 104 and the mapping table. In some embodiments, a photomask set including several photomasks may be designed or pre-provided for the determined layout pattern.

Step 108: Continue the rest of the fabrication of the integrated component according to the determined layout pattern in Step 106, which includes the later manufacturing process (es) corresponding to the determined layout pattern in Step 106. One or more connecting elements may be manufactured to adjust the electrical property value of the passive device. Alternatively, the determined layout pattern in Step 106 may have none connecting element between the passive device and the sub-cells.

Step 110: Finish the fabrication of the integrated component.

It is noteworthy that Step 108 can be executed on various occasions. In one embodiment, Step 108 can be executed right after the measuring result of one wafer is obtained or right after the measuring results of a lot of wafers are obtained. Wherein, to determine the layout pattern of a later manufacturing process may be based on the individual measuring result or the average value of the measuring results for example. In another embodiment, the wafers with the manufactured passive device and sub-cells may be classified into several groups according to their measuring results, wherein each group is determined for an individual layout pattern corresponding to the later manufacturing process for adjusting the electrical property of the passive devices, and therefore Step 108 may be executed according to the determined individual layout pattern for each group.

In summary, the embodiments of the present invention provide a method to control the electrical property of the passive device during the fabrication of an integrated component. According to the method, at least one sub-cell for adjusting the electrical property of the passive device, whose electrical property is predetermined to be controlled, is formed, and the original electrical property, such as capacitance value, resistance value, or inductance value, of the passive device is measured after the passive device is manufactured. Then, at least one layout pattern corresponding to at least one later manufacturing process is determined based on the measuring results, wherein the determined layout pattern represents how many sub-cells will be electrically connected to the passive device for adjusting the electrical property of the passive device. Accordingly, the electrical property of the passive device is controlled during the fabrication of the integrated component, which means the control and adjustment of the electrical property of the passive device is executed by at least a manufacturing process on the wafer or on the semiconductor substrate. According to the embodiments of the present invention, the manufacturer can assure that the adjusted passive device has a preferable electrical property or has a value of electrical property in a predetermined range, rather than discovering the electrical property of the passive device is unqualified after finishing the whole fabrication of the integrated component and then the unqualified integrated component has to be thrown away in such situation. The advantage of the embodiments of the present invention is especially apparent when a new fabrication tool is adopted for fabricating the integrated component or when the integrated components are fabricated with different fabrication tools. Therefore, the fabrication performance can be effectively improved and the fabrication cost can be greatly saved according to the method and structure of the integrated component according to the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling an electrical property of a passive device during a fabrication of an integrated component, comprising:

providing a substrate;
manufacturing the passive device on the substrate;
measuring the electrical property of the passive device to obtain a measuring result;
determining at least one layout pattern corresponding to at least one later manufacturing process by the measuring result for adjusting the electrical property of the passive device; and
continuing the rest of the fabrication including the at least one later manufacturing process of the integrated component.

2. The method for controlling the electrical property of the passive device of claim 1, wherein the step of determining the at least one layout pattern corresponding to the at least one later manufacturing process comprises according to the measuring result, selecting at least one photomask corresponding to the determined layout pattern from a plurality of predetermined photomasks of the later manufacturing process.

3. The method for controlling the electrical property of the passive device of claim 2, wherein the step of selecting at least one photomask is performed according to a mapping table of values of the measuring result and the corresponding predetermined photomasks of the later manufacturing process.

4. The method for controlling the electrical property of the passive device of claim 1, further comprising forming at least one sub-cell adjacent to the passive device.

5. The method for controlling the electrical property of the passive device of claim 4, wherein the sub-cell and the passive device are manufactured before the step of determining at least one layout pattern corresponding to at least one later manufacturing process.

6. The method for controlling the electrical property of the passive device of claim 4, wherein the step of determining the at least one layout pattern corresponding to the at least one later manufacturing process comprises determining how many sub-cells should be electrically connected to the passive device for adjusting the electrical property of the passive device.

7. The method for controlling the electrical property of the passive device of claim 4, wherein the at least one later manufacturing process corresponding to the at least one layout pattern comprises electrically connecting at least one sub-cell to the passive device.

8. The method for controlling the electrical property of the passive device of claim 4, wherein the at least one later manufacturing process corresponding to the at least one layout pattern comprises not electrically connecting any sub-cell to the passive device.

9. The method for controlling the electrical property of the passive device of claim 4, wherein a plurality of sub-cells are formed and the sub-cells have identical sizes.

10. The method for controlling the electrical property of the passive device of claim 4, wherein a plurality of sub-cells are formed and the sub-cells have different sizes.

11. The method for controlling the electrical property of the passive device of claim 10, wherein a binary multiple theory is used for determining the at least one layout pattern corresponding to the at least one manufacturing process by determining which sub-cell(s) should be electrically connected to the passive device for adjusting the electrical property of the passive device.

12. The method for controlling the electrical property of the passive device of claim 1, wherein the passive device comprises at least one of a capacitor, a resistor, and an inductor.

13. The method for controlling the electrical property of the passive device of claim 1, wherein the integrated component is an integrated passive device (IPD).

14. An integrated component, comprising:
a semiconductor substrate;
a passive device formed on the semiconductor substrate, the passive device comprising at least one first conductive element; and
at least one sub-cell disposed adjacent to the passive device, the sub-cell is used for adjusting an electrical property of the passive device through at least one manufacturing process, the sub-cell comprising at least one first sub-cell conductive element, wherein the first sub-cell conductive element and the first conductive element of the passive device are formed with a same first conductive layer.

15. The integrated component of claim 14, wherein the passive device comprises at least one second conductive element formed with a second conductive layer.

16. The integrated component of claim 15, wherein the sub-cell comprises a second sub-cell conductive element, and the second sub-cell conductive element and the second conductive element of the passive device are formed with the same second conductive layer.

17. The integrated component of claim 15, wherein the sub-cell comprises a second sub-cell conductive element, and the second sub-cell conductive element is formed with a third conductive layer different from the second conductive layer and the first conductive layer.

18. The integrated component of claim 14, further comprising at least one connecting element that electrically connects the passive device to the sub-cell for adjusting the electrical property of the passive device.

19. The integrated component of claim 18, wherein the connecting element is formed with a third conductive layer.

20. The integrated component of claim 18, the at least one manufacturing process comprises forming the connecting element on the semiconductor substrate.

21. The integrated component of claim 18, wherein the connecting element comprises at least one contact plug and a connecting line.

22. The integrated component of claim 14, wherein the electrical property of the passive device is capable of being adjusted through determining at least one layout pattern of the at least one manufacturing process on the semiconductor substrate.

23. The integrated component of claim 14, wherein the integrated component comprises a plurality of sub-cells disposed adjacent to the passive device for adjusting the electrical property of the passive device through the at least one manufacturing process, and each of the sub-cells comprises a second sub-cell conductive element.

* * * * *